US009153616B2

(12) United States Patent
Kondo

(10) Patent No.: US 9,153,616 B2
(45) Date of Patent: Oct. 6, 2015

(54) SOLID-STATE IMAGING DEVICE AND IMAGING DEVICE WITH CIRCUIT ELEMENTS DISTRIBUTED ON MULTIPLE SUBSTRATES, METHOD OF CONTROLLING SOLID-STATE IMAGING DEVICE, AND IMAGING DEVICE WITH CIRCUIT ELEMENTS DISTRIBUTED ON MULTIPLE SUBSTRATES

(71) Applicant: OLYMPUS CORPORATION, Tokyo (JP)

(72) Inventor: Toru Kondo, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 162 days.

(21) Appl. No.: 13/727,256

(22) Filed: Dec. 26, 2012

(65) Prior Publication Data

US 2014/0176770 A1   Jun. 26, 2014

(51) Int. Cl.
*H04N 5/374* (2011.01)
*H01L 27/146* (2006.01)
*H04N 5/335* (2011.01)

(52) U.S. Cl.
CPC .... *H01L 27/14634* (2013.01); *H01L 27/14636* (2013.01); *H04N 5/374* (2013.01)

(58) Field of Classification Search
CPC ..... H04N 5/335; H04N 5/376; H04N 5/3765; H04N 3/1575; H04N 5/2258; H04N 17/002
USPC ............. 348/222.1, 312, 294, 340, 373–376; 438/118
See application file for complete search history.

(56) References Cited

U.S. PATENT DOCUMENTS 6,833,626 B2 * 12/2004 Kajiwara et al. .............. 257/777
7,030,926 B2 *  4/2006 Miyake et al. ................ 348/340
7,405,764 B2 *  7/2008 Gustavsson et al. .......... 348/374
2003/0148558 A1 *  8/2003 Kubo et al. ................... 438/128
2006/0023109 A1 *  2/2006 Mabuchi et al. .............. 348/340

(Continued)

FOREIGN PATENT DOCUMENTS

JP    2006-49361 A    2/2006
JP    2007-228460 A   9/2007

(Continued)

OTHER PUBLICATIONS

Office Action dated May 12, 2015, issued in counterpart Japanese patent application No. 2011-147171, with English translation (3 pages).

*Primary Examiner* — Hung Lam
(74) *Attorney, Agent, or Firm* — Westerman, Hattori, Daniels & Adrian, LLP

(57) ABSTRACT

In the solid-state imaging device, first and second substrates are electrically connected to each other via connectors electrically connecting the first and second substrates. A photoelectric conversion element is disposed in the first substrate. A read circuit is disposed in the second substrate and reads a signal generated by the photoelectric conversion element and transmitted via the connector. In a signal processing circuit including elements or circuits performing signal processing on the read signal, some of the elements or circuits are disposed in the first substrate, the remaining elements or circuits are disposed in the second substrate, and the elements or circuits disposed in the first and second substrates are electrically connected to each other via the connector.

49 Claims, 10 Drawing Sheets

(56) References Cited

U.S. PATENT DOCUMENTS

| | | | |
|---|---|---|---|
| 2007/0069258 A1* | 3/2007 | Ahn | 257/290 |
| 2008/0284888 A1* | 11/2008 | Kobayashi | 348/308 |
| 2009/0230287 A1* | 9/2009 | Anderson et al. | 250/208.1 |
| 2013/0033632 A1* | 2/2013 | Kishi | 250/208.1 |
| 2013/0048832 A1* | 2/2013 | Peizerat et al. | 250/208.1 |
| 2013/0119233 A1* | 5/2013 | Guezzi et al. | 250/208.1 |

FOREIGN PATENT DOCUMENTS

| | | |
|---|---|---|
| JP | 2008-235478 A | 10/2008 |
| JP | 2009-141401 A | 6/2009 |
| JP | 2010-219339 A | 9/2010 |

* cited by examiner

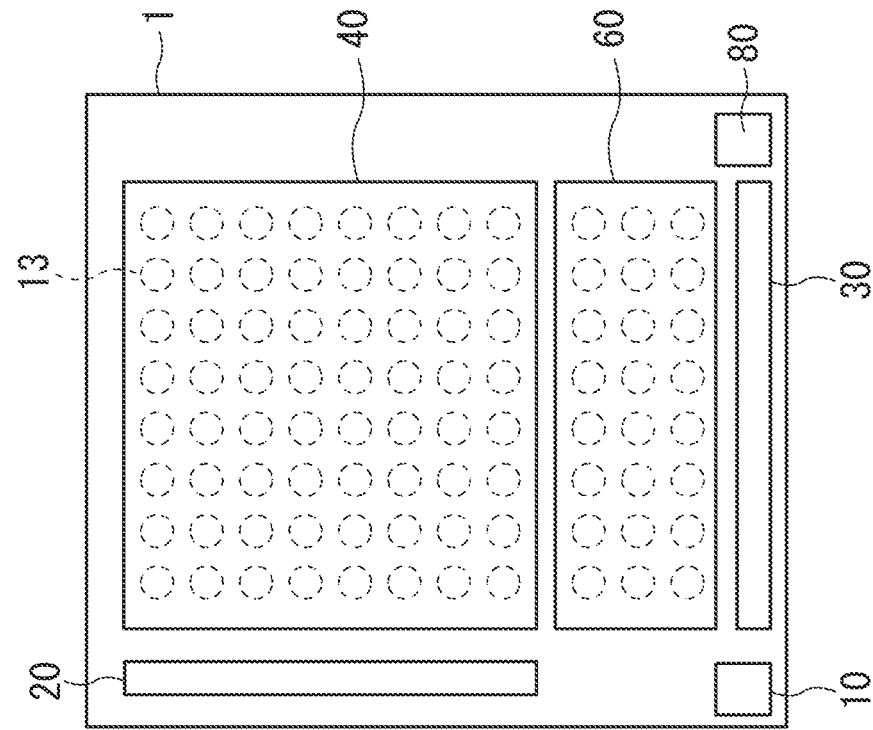
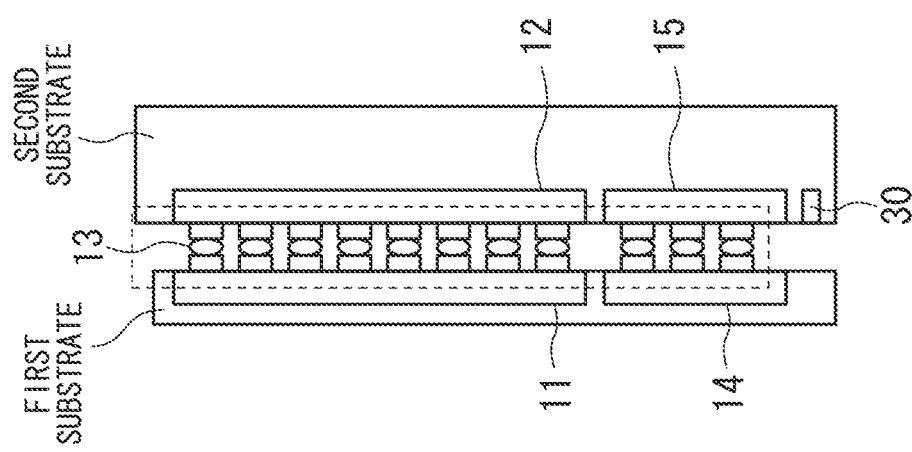

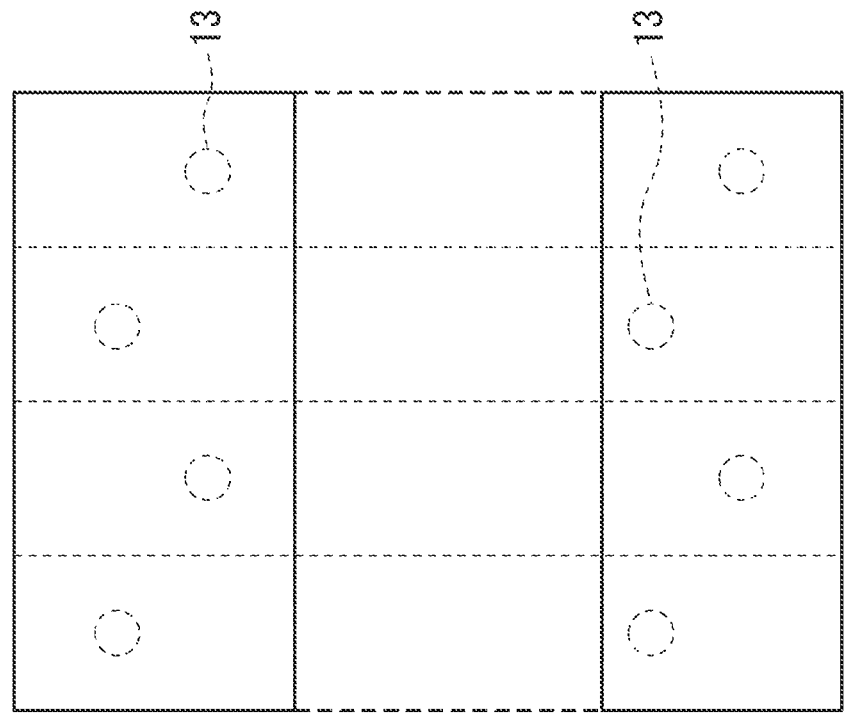
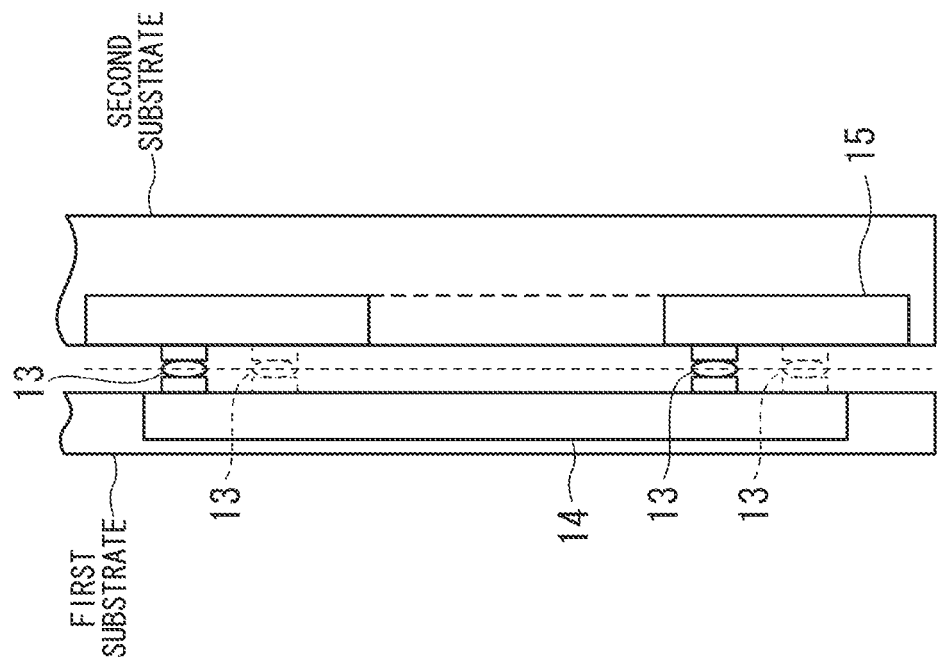

SOLID-STATE IMAGING DEVICE AND IMAGING DEVICE WITH CIRCUIT ELEMENTS DISTRIBUTED ON MULTIPLE SUBSTRATES, METHOD OF CONTROLLING SOLID-STATE IMAGING DEVICE, AND IMAGING DEVICE WITH CIRCUIT ELEMENTS DISTRIBUTED ON MULTIPLE SUBSTRATES

BACKGROUND OF THE INVENTION

1. Field of the Invention

The present invention relates to a solid-state imaging device, a method of controlling the solid-state imaging device, and an imaging device.

2. Description of Related Art

In recent years, imaging devices such as video cameras and electronic still cameras have generally come into wide use. Charge coupled device (CCD)-type or amplification-type solid-state imaging devices have been used in such imaging devices (hereinafter referred to as "cameras"). In the amplification-type solid-state imaging devices, a plurality of pixels are arrayed in a matrix form. In the amplification-type solid-state imaging devices, signal charges generated and stored by photoelectric conversion units serving as light-receiving units of pixels are guided toward amplification portions installed in the pixels, and the signals amplified by the amplification portions are output as output signals from the pixels.

Examples of the amplification-type solid-state imaging device include a solid-state imaging device in which a junction field effect transistor is used in an amplification portion and a complementary metal oxide semiconductor (CMOS)-type solid-state imaging device in which a CMOS transistor is used in an amplification portion.

In the past, a general CMOS-type solid-state imaging device (hereinafter, also referred to as a "solid-state imaging device") has utilized a method of sequentially reading signal charges generated and stored by photoelectric conversion units of pixels arrayed in a two-dimensional matrix form from each row. According to this reading method, an exposure timing in the photoelectric conversion unit of each pixel is determined by start and end of the reading of the signal charge. Therefore, the exposure timing is different in each pixel. Therefore, when a fast moving subject is imaged using such a CMOS-type solid-state imaging device, the subject in the captured image may be distorted.

As an exposure method of eliminating the distortion of the subject, a simultaneous imaging function (hereinafter referred to as a "global shutter function") of generating signal charges and realizing simultaneity of the storage of the signal charges by exposing all of the pixels at the same timing has been suggested. CMOS-type solid-state imaging devices having the global shutter function tend to be used for many purposes.

In the CMOS-type solid-state imaging devices having the global shutter function, it is generally necessary to store the signal charges generated by the photoelectric conversion units until reading ends. Therefore, a storage capacitor having a light-shielding property is necessary. In the CMOS-type solid-state imaging devices having the global shutter function according to the related art, after simultaneous exposure of all of the pixels, the signal charges generated by the photoelectric conversion units are simultaneously transmitted to the storage capacitors in all of the pixels and are stored once, and then the signal charges stored in the storage capacitors are sequentially converted into pixel signals at a predetermined reading timing.

As a technology for resolving such a problem, for example, Japanese Unexamined Patent Application, First Publication No. 2010-219339 discloses a method of suppressing an increase in a chip area (mounting area) of a solid-state imaging device by separately manufacturing a first substrate in which photoelectric conversion units are formed and a second substrate in which a plurality of MOS transistors are formed and by joining the first and second substrates together to form one solid-state imaging device. According to the technology disclosed in Japanese Unexamined Patent Application, First Publication No. 2010-219339, the separately manufactured first and second substrates are electrically connected to each other by connection electrodes.

According to the technology disclosed in Japanese Unexamined Patent Application, First Publication No. 2010-219339, pixels having the global shutter function according to the related art are distributed between the two substrates. Accordingly, an increase in the chip area of the first substrate can be avoided. By joining the first and second substrates together, it is possible to prevent a signal quality from deteriorating due to noise caused by light during a waiting period until the signal charges stored in the storage capacitors are read.

FIGS. 10A and 10B are diagrams illustrating the overview of a connection configuration of substrates of a solid-state imaging device of the related art to which the technology disclosed in Japanese Unexamined Patent Application, First Publication No. 2010-219339 is applied. FIG. 10A is a side view illustrating the connection configuration of the first and second substrates of a solid-state imaging device 100. FIG. 10B is a top view illustrating the connection configuration of the first and second substrates of the solid-state imaging device 100.

In the solid-state imaging device 100, as shown in FIG. 10A, a pixel unit 11 formed in the first substrate and a pixel unit 12 formed in the second substrate are connected to each other via inter-substrate connector 13. More specifically, photoelectric conversion units are formed in the pixel unit 11 and the storage capacitors are formed in the pixel unit 12. In the inter-substrate connector 13, for example, the photoelectric conversion unit in the pixel unit 11 and the storage capacitor in the pixel unit 12 are connected to each other via a bump. Thus, in the solid-state imaging device 100, the pixel units 11 and 12 connected to each other via the bumps are configured to form a lamination structure in the region of a pixel array unit 40 of the solid-state imaging device 100.

The technology disclosed in Japanese Unexamined Patent Application, First Publication No. 2010-219339 discloses processes (manufacturing processes) of thinning the first substrate and forming color filters or micro-lenses after connecting the first and second substrates to each other. This means that when the chip area of the first substrate is different from that of the second substrate, as shown in FIGS. 10A and 10B, the process of connecting the first and second substrates to each other in units of chips is performed and then the manufacturing processes of thinning the substrate and forming the color filters or the micro-lenses are also performed in units of chips.

SUMMARY OF THE INVENTION

According to a first aspect of the present invention, a solid-state imaging device in which first and second substrates are electrically connected to each other via connector includes: photoelectric conversion elements, read circuits that each read a signal generated by the photoelectric conversion elements, and signal processing circuits that each include elements or circuits performing signal processing on the signal read by each read circuit. The photoelectric conversion elements are disposed in the first substrate. The read circuits are disposed in the second substrate and read the signals generated by the photoelectric conversion elements and transmitted via the connector, and in each signal processing circuit, some of the elements or the circuits included in the signal processing circuit are disposed in the first substrate, rest of the elements or the circuits included in the signal processing circuit are disposed in the second substrate, and the elements or the circuits disposed in the first substrate are electrically connected to the elements or the circuits disposed in the second substrate via the connector.

According to a second aspect of the present invention, in the solid-state imaging device of the first aspect, in the first substrate, some of the elements or the circuits of each signal processing circuit are disposed in a region other than a region of a pixel unit in which the photoelectric conversion elements are disposed.

According to a third aspect of the present invention, in the solid-state imaging device of the second aspect, the other region is a region smaller than a difference between a size of the first substrate in a case in which only the region of the pixel unit in which the photoelectric conversion elements are disposed is included, and a size of the second substrate in a case in which the read circuits and all of the elements or the circuits included in each signal processing circuit are disposed.

According to a fourth aspect of the present invention, in the solid-state imaging device of the second aspect, a size of the first substrate including the region of the pixel unit and the other region is set to be the same as a size of the second substrate in which the read circuit and the rest of the elements or the circuits included in each signal processing circuit are disposed.

According to a fifth aspect of the present invention, in the solid-state imaging device of the fourth aspect, when the size of the first substrate in a case in which only the region of the pixel unit in which the photoelectric conversion elements are disposed is included is smaller than the size of the second substrate in a case in which the read circuits and all of the elements or the circuits included in each signal processing circuit are disposed, the size of the first substrate is set to be the same as the size of the second substrate by expanding the other region to move and dispose some of the elements or the circuits of each signal processing circuit disposed in the first substrate to expand the size of the first substrate and by reducing a region in which the rest of the elements or the circuits of each signal processing circuit in the second substrate are disposed to reduce the size of the second substrate.

According to a sixth aspect of the present invention, in the solid-state imaging device of the first aspect, each pixel in the solid-state imaging device includes the photoelectric conversion element disposed in the first substrate and the read circuit disposed in the second substrate. In the pixel outputs the signal generated by the photoelectric conversion element and read by the read circuit as an output signal from the pixel.

According to a seventh aspect of the present invention, in the solid-state imaging device of the sixth aspect, the pixel further includes: an amplification circuit that is disposed in the first substrate and outputs an amplified signal obtained by amplifying the signal generated by the photoelectric conversion element, a load circuit that is disposed in the second substrate and serves as a load of the amplification circuit, and a signal storage circuit that is disposed in the second substrate and stores the amplified signal output by the amplification circuit. The pixel outputs the amplified signal stored in the signal storage circuit as the output signal from the pixel.

According to a eighth aspect of the present invention, in the solid-state imaging device of the seventh aspect, The photoelectric conversion elements of all the pixels are simultaneously reset. After a predetermined time has elapsed, the signals generated by the photoelectric conversion elements are simultaneously amplified by the amplification circuits of all the pixels. The amplified signals amplified by the amplification circuits are simultaneously stored in the signal storage circuits of all the pixels. The amplified signals stored in the signal storage circuits are sequentially read by the read circuit and are output as the output signals from the pixels.

According to a ninth aspect of the present invention, in the solid-state imaging device of the sixth aspect, the signal processing circuit further includes a passive element. Some of elements or circuits including the passive element in each signal processing circuit are disposed in a region other than a region of a pixel unit in which the photoelectric conversion elements are disposed in the first substrate.

According to a tenth aspect of the present invention, in the solid-state imaging device of the ninth aspect, The other region is a region smaller than a difference between a size of the first substrate in a case in which only the region of the pixel unit in which the photoelectric conversion elements are disposed is included and a size of the second substrate in a case in which the read circuits and all of the elements or the circuits included in each signal processing circuit are disposed.

According to a eleventh aspect of the present invention, in the solid-state imaging device of the ninth aspect, A size of the first substrate in which the region of the pixel unit and the other region are included is set to be the same as a size of the second substrate in which the read circuit and the rest of the elements or the circuits included in each signal processing circuit are disposed.

According to a twelfth aspect of the present invention, in the solid-state imaging device of the eleventh aspect, when the size of the first substrate in a case in which only the region of the pixel unit in which the photoelectric conversion element is disposed is included is smaller than the size of the second substrate in a case in which the read circuit and all of the elements or the circuits included in each signal processing circuit are disposed, the size of the first substrate is set to be the same as the size of the second substrate by expanding the other region to move and dispose some of the elements or the circuits including the passive element of each signal processing circuit disposed in the first substrate to expand the size of the first substrate and by reducing a region in which the rest of the elements or the circuits of each signal processing circuit in the second substrate are disposed to reduce the size of the second substrate.

According to a thirteenth aspect of the present invention, in the solid-state imaging device of the ninth aspect, the passive element is a capacitor element that retains the output signal output from the pixel.

According to a fourteenth aspect of the present invention, in the solid-state imaging device of the ninth aspect, the signal processing circuit further includes a signal amplification circuit.

According to a fifteenth aspect of the present invention, in the solid-state imaging device of the first aspect, the connector between the first and second substrates are connected in a wafer state and the first and second substrates are cut to a size of the solid-state imaging device after the first and second substrates are connected to each other.

According to a sixteenth aspect of the present invention, in the solid-state imaging device of the first aspect, a semiconductor process of manufacturing the first substrate and a semiconductor process of manufacturing the second substrate are different semiconductor processes.

According to a seventeenth aspect of the present invention, in the solid-state imaging device of the first aspect, the signal processing circuit further includes a noise signal reduction circuit that reduces noise from the read signal. Among elements or circuits included in the noise signal reduction circuit, an element or a circuit corresponding to a passive element is disposed as an element or circuit of the signal processing circuit in the first substrate.

According to a eighteenth aspect of the present invention, in the solid-state imaging device of the seventh aspect, among the elements or circuits included in the noise signal reduction circuit, elements or circuits other than the element or circuit corresponding to the passive element in the noise signal reduction circuit are disposed as the rest of the elements or the circuits of the signal processing circuit in the second substrate.

According to a nineteenth aspect of the present invention, in the solid-state imaging device of the first aspect, the signal processing circuit further includes a noise signal reduction circuit that reduces noise from the read signal. Elements corresponding to passive elements included in the noise signal reduction circuit are configured as a plurality of elements. Among elements or circuits included in the noise signal reduction circuit, elements or circuits including the elements corresponding to some of the passive elements are disposed as some of the elements or the circuits of the signal processing circuit in the first substrate.

According to a twentieth aspect of the present invention, in the solid-state imaging device of the nineteenth aspect, the noise signal reduction circuit includes a signal amplification circuit. Among the elements or the circuits included in the noise signal reduction circuit, the elements or the circuits including the signal amplification circuit are disposed as the reset of the elements or the circuits of the signal processing circuit in the second substrate.

According to a twenty first aspect of the present invention, in the solid-state imaging device of the first aspect, some of the elements or circuits of the signal processing circuit are elements or circuits having a relatively larger area when disposed in the substrate, among all of the elements or the circuits of the signal processing circuit.

According to a twenty second aspect of the present invention, in the solid-state imaging device of the first aspect, in the solid-state imaging device, a plurality of pixels that each include the photoelectric conversion element disposed in the first substrate and the read circuit disposed in the second substrate are arrayed in a matrix form. The plurality of signal processing circuits are disposed in correspondence with columns of the plurality of pixels arrayed in the matrix form.

According to a twenty third aspect of the present invention, in the solid-state imaging device of the first aspect, the connector of the signal processing circuits disposed in a column direction of the pixels are disposed to be shifted from the disposition positions of the connector of the other adjacent signal processing circuits, without being arranged in the column direction of the pixels, in a region in which the elements or circuits included in each signal processing circuit are disposed.

According to a twenty fourth aspect of the present invention, the solid-state imaging device of the first aspect, further includes a signal storage circuit that stores the signal generated by the photoelectric conversion element and the read circuit reads the signal stored in the signal storage circuit.

According to a twenty fifth aspect of the present invention, in the solid-state imaging device of the twenty fourth aspect, the signal storage circuit is disposed in the second substrate.

According to a twenty sixth aspect of the present invention, the solid-state imaging device of the twenty fourth aspect further includes an amplification circuit that outputs an amplified signal obtained by amplifying the signal generated by the photoelectric conversion element, and the signal storage circuit stores the amplified signal amplified by the amplification circuit.

According to a twenty seventh aspect of the present invention, the solid-state imaging device of the twenty sixth aspect further includes a noise reduction circuit that reduces noise from the amplified signal amplified by the amplification circuit, and the signal storage circuit stores the amplified signal from which the noise is reduced by the noise reduction circuit.

According to a twenty eighth aspect of the present invention, in the solid-state imaging device of the twenty seventh aspect, the amplification circuit includes an amplification transistor of which a gate receives the signal generated by the photoelectric conversion element and one of a source and a drain outputs the amplified signal.

According to a twenty ninth aspect of the present invention, in the solid-state imaging device of the twenty eighth aspect, the noise reduction circuit includes: a clamp capacitor that is connected directly or indirectly to one of the source and the drain of the amplification transistor and clamps the output amplified signal, and a sample and hold transistor that is connected directly or indirectly to the clamp capacitor, and samples and holds the clamped amplified signal. The signal storage circuit stores the amplified signal sampled and held by the sample and hold transistor.

According to a thirtieth aspect of the present invention, in the solid-state imaging device of the twenty fourth aspect, a connection point of each connector on a side of the first substrate and a connection point of each connector on a side of the second substrate are disposed at one position on a path from an output terminal of the photoelectric conversion element to an input terminal of the signal storage circuit.

According to a thirty first aspect of the present invention, in the solid-state imaging device of the first aspect, the connector is a bump.

According to a thirty second aspect of the present invention, in the solid-state imaging device of the first aspect, the connector includes a first electrode formed on a surface of the first substrate and a second electrode formed on a surface of the second substrate and joined to the first electrode.

According to a thirty third aspect of the present invention, in the solid-state imaging device of the first aspect, the second substrate is connected to an opposite surface to the surface of the first substrate to which light incident on the photoelectric conversion element is radiated.

According to a thirty fourth aspect of the present invention, in the solid-state imaging device of the first aspect, a pixel unit of the first substrate includes: the photoelectric conversion element, a transfer circuit that transfers the signal generated by the photoelectric conversion element, a first amplification circuit that amplifies the signal generated by the photoelectric conversion element, and a first reset circuit that resets an input portion of the first amplification circuits. a pixel unit of the second substrate includes: an analog memory circuit, a second amplification circuit that amplifies a signal of the analog memory circuit, and a second reset circuit that resets an input portion of the second amplification circuit.

According to a thirty fifth aspect of the present invention, a method of controlling a solid-state imaging device in which first and second substrates are electrically connected to each other via connector electrically connecting the first and second substrates to each other includes: reading a signal generated by a photoelectric conversion element disposed in the first substrate and transmitted via the connector by a read circuit disposed in the second substrate; and performing signal processing on the signal read by the read circuit by a signal processing circuit in which some of the elements or the circuits are disposed in the first substrate, rest of the elements or the circuits are disposed in the second substrate, and the elements or the circuits disposed in the first substrate are electrically connected to the elements or the circuits disposed in the second substrate via the connector.

According to a thirty sixth aspect of the present invention, an imaging device in which first and second substrates are electrically connected to each other via connector electrically connecting the first and second substrates to each other includes: a photoelectric conversion element, a read circuit that reads a signal generated by the photoelectric conversion element and a signal processing circuit that includes elements or circuits performing signal processing on the signal read by each read circuit. The photoelectric conversion element is disposed in the first substrate. The read circuit is disposed in the second substrate and reads the signal generated by the photoelectric conversion element and transmitted via the connector. In the signal processing circuit, some elements or circuits included in the signal processing circuit are disposed in the first substrate, rest of the elements or the circuits included in the signal processing circuit are disposed in the second substrate, and the elements or the circuits disposed in the first substrate are electrically connected to the elements or the circuits disposed in the second substrate via the connector.

According to a thirty seventh aspect of the present invention, a solid-state imaging device in which first and second substrates are electrically connected to each other via connector electrically connecting the first and second substrates to each other includes: a photoelectric conversion element, a read transistor of which one of a source and a drain receives a signal generated by the photoelectric conversion element and the other of the source and the drain outputs the signal, and a signal processing circuit that includes capacitors or transistors performing signal processing on the signal output by the read transistor. The photoelectric conversion element is disposed in the first substrate. The read transistor is disposed in the second substrate and outputs the signal generated by the photoelectric conversion element and transmitted via the connector. In the signal processing circuit, some capacitors or transistors included in the signal processing circuit are disposed in the first substrate, the remaining capacitors or transistors included in the signal processing circuit are disposed in the second substrate, and the capacitors or transistors disposed in the first substrate are electrically connected to the capacitors or transistors disposed in the second substrate via the connector.

According to a thirty eighth aspect of the present invention, in the solid-state imaging device of the thirty seventh aspect, in the first substrate, some of the capacitors or transistors of the signal processing circuit are disposed in a region other than a region of a pixel unit in which the photoelectric conversion element is disposed.

According to a thirty ninth aspect of the present invention, in the solid-state imaging device of the thirty seventh aspect, a pixel in the solid-state imaging device includes the photoelectric conversion element disposed in the first substrate and the read transistor disposed in the second substrate. The pixel further includes: an amplification transistor which is disposed in the first substrate, of which a gate receives the signal generated by the photoelectric conversion element, and which outputs an amplified signal amplified by one of a source and a drain, a load transistor that is disposed in the second substrate and serves as a load of the amplification transistor, and a signal storage capacitor that is disposed in the second substrate and stores the amplified signal output by the amplification transistor. The pixel outputs the amplified signal read by the read transistor and stored in the signal storage capacitor as an output signal from the pixel.

According to a fortieth aspect of the present invention, in the solid-state imaging device of the thirty seventh aspect, the signal processing circuit further includes a signal amplification amplifier.

According to a forty first aspect of the present invention, in the solid-state imaging device of the thirty seventh aspect, the signal processing circuit further includes a noise signal reduction circuit that reduces noise from the read signal. Among capacitors or transistors included in the noise signal reduction circuit, a capacitor or a transistor corresponding to a passive element is disposed as a capacitor or transistor of the signal processing circuits in the first substrate.

According to a forty second aspect of the present invention, in the solid-state imaging device of the forty first aspect, among the capacitors or transistors included in the noise signal reduction circuit, capacitors or transistors other than the capacitor or transistor corresponding to the passive element in the noise signal reduction circuit are disposed as the remaining capacitors or transistors of the signal processing circuit in the second substrate.

According to a forty third aspect of the present invention, in the solid-state imaging device of the thirty seventh aspect, the signal processing circuit further includes a noise signal reduction circuit that reduces noise from the read signal. Capacitors corresponding to passive elements included in the noise signal reduction circuit are configured as a plurality of capacitors. Among capacitors or transistors included in the noise signal reduction circuit, capacitors or transistors including the capacitors corresponding to some of the passive elements are disposed as some of the capacitors or the transistors of the signal processing circuit in the first substrate.

According to a forty fourth aspect of the present invention, in the solid-state imaging device of the forty third aspect, the noise signal reduction circuit includes a signal amplification amplifier. Among the capacitors or transistors included in the noise signal reduction circuit, capacitors or transistors including the signal amplification circuit are disposed as the remaining capacitors or transistors of the signal processing circuit in the second substrate.

According to a forty fifth aspect of the present invention, the solid-state imaging device of the thirty seventh aspect, further includes a signal storage capacitor that stores the signal generated by the photoelectric conversion element. The read transistor reads the signal stored in the signal storage capacitor.

According to a forty sixth aspect of the present invention, in the solid-state imaging device of the forty fifth aspect, the signal storage capacitor is disposed in the second substrate.

According to a forty seventh aspect of the present invention, the solid-state imaging device of the forty fifth aspect further includes an amplification transistor of which a gate receives the signal generated by the photoelectric conversion element and which outputs an amplified signal amplified by one of a source and a drain. The signal storage capacitor stores the amplified signal output by the amplification transistor.

According to a forty eighth aspect of the present invention, the solid-state imaging device of the forty seventh aspect further includes a clamp capacitor that is connected directly or indirectly to one of the source and the drain of the amplification transistor and clamps the output amplified signal and a sample and hold transistor which is connected directly or indirectly to the clamp capacitor, in which one of a source and a drain receives the amplified signal clamped by the clamp capacitor and samples and holds the amplified signal, and the other of the source and the drains outputs the amplified signal. The signal storage capacitor stores the amplified signal sampled and held by the sample and hold transistor.

According to a forty ninth aspect of the present invention, in the solid-state imaging device of the thirty seventh aspect, a pixel unit of the first substrate includes the photoelectric conversion element, a transfer transistor of which one of a source and a drain receives the signal generated by the photoelectric conversion element and the other of the source and the drain outputs the signal generated by the photoelectric conversion element, a first amplification transistor of which a gate receives the signal output by the transfer transistor and one of a source and a drain outputs a first amplified signal, and a first reset transistor that resets the gate of the first amplification transistor. A pixel unit of the second substrate includes an analog memory circuit, a second amplification transistor of which a gate receives a signal of the analog memory circuit and one of a source and a drain outputs a second amplified signal, and a second reset transistor that resets the gate of the second amplification transistor.

According to a fifty aspect of the present invention, a method of controlling a solid-state imaging device in which first and second substrates are electrically connected to each other via connector electrically connecting the first and second substrates to each other includes: outputting a signal, which is generated by a photoelectric conversion element disposed in the first substrate and transmitted via the connector and received by one of a source and a drain of a read transistor disposed in the second substrate, from the other of the source and the drain of the read transistor, and performing signal processing on the signal output from the other of the source and the drain of the read transistor by a signal processing circuit in which some capacitors or transistors are disposed in the first substrate, the remaining capacitors or transistors are disposed in the second substrate, and the capacitors or transistors disposed in the first substrate are electrically connected to the capacitors or transistors disposed in the second substrate via the connector.

According to a fifty first aspect of the present invention, an imaging device in which first and second substrates are electrically connected to each other via connector includes: a photoelectric conversion element, a read transistor of which one of a source and a drain receives a signal generated by the photoelectric conversion element and the other of the source and the drain outputs the signal and a signal processing circuit that includes capacitors or transistors performing signal processing on the signal output by the read transistor. The photoelectric conversion element is disposed in the first substrate. The read transistor is disposed in the second substrate and outputs the signal generated by the photoelectric conversion element and transmitted via the connector. In the signal processing circuit, some capacitors or transistors included in the signal processing circuit are disposed in the first substrate, the remaining capacitors or transistors included in the signal processing circuit are disposed in the second substrate, and the capacitors or transistors disposed in the first substrate are electrically connected to the capacitors or transistors disposed in the second substrate via the connector.

BRIEF DESCRIPTION OF THE DRAWINGS

FIG. 5A is diagram illustrating the overview of a connection configuration of substrates of the solid-state imaging device according to the first embodiment.

FIG. 5B is diagram illustrating the overview of a connection configuration of substrates of the solid-state imaging device according to the first embodiment.

FIG. 6A is diagram schematically illustrating disposition of inter-substrate connector in the solid-state imaging device according to the first embodiment.

FIG. 6B is diagram schematically illustrating disposition of inter-substrate connector in the solid-state imaging device according to the first embodiment.

DETAILED DESCRIPTION OF THE INVENTION

Hereinafter, an embodiment of the invention will be described with reference to the drawings. The following description includes specific detailed contents as examples. However, those skilled in the art should, of course, understand that the detailed contents may be varied or modified and the variations and modifications of the contents are within the scope of the invention. Accordingly, various exemplary embodiments to be described below will be described without loss of generality of the invention described in the claims and without limitation on the invention.

Figure 1:
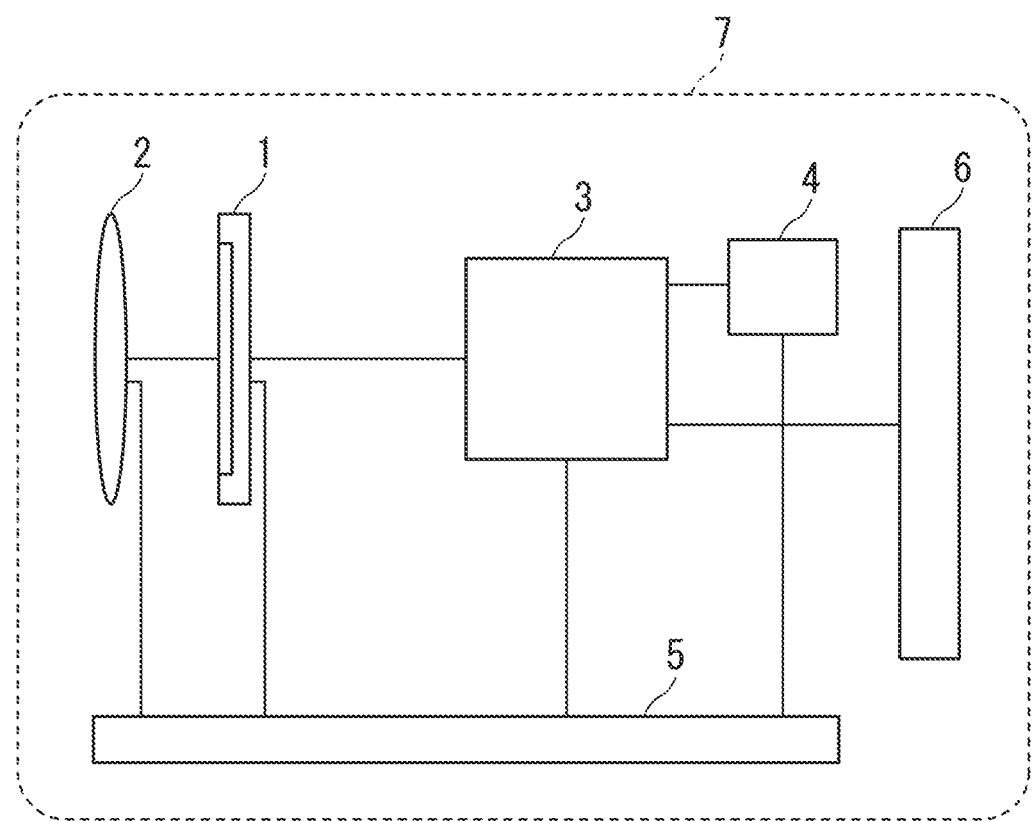
FIG. 1 is a block diagram illustrating a general configuration of a digital camera according to an embodiment of the invention.

FIG. 1 is a block diagram illustrating a general configuration of a digital camera (for example, a digital single-lens reflex camera system) according to the embodiment. Constituent elements shown herein can be realized by hardware components such as a CPU and a memory of a computer, or can also be realized by software such as a computer program. Here, each constituent element is illustrated as a functional block realized in association with the hardware and software. Accordingly, those skilled in the art should understand that the functional blocks are realized in various forms by the combination of the hardware and software.

A digital camera 7 shown in FIG. 1 includes a lens unit 2, a solid-state imaging device 1, an image signal processing device 3, a recording device 4, a camera control device 5, and a display device 6. The digital camera 7 shown in FIG. 1 is a digital camera that performs global exposure to simultaneously expose all of the pixels and does not include a mechanical shutter that shields the solid-state imaging device 1 from light.

In the lens unit 2, driving of zoom, focus, a stop, or the like is controlled by the camera control device 5 so that a subject image is formed in the solid-state imaging device 1.

The solid-state imaging device 1 is a MOS-type solid-state imaging device that is driven and controlled by the camera control device 5 to convert subject light incident on the solid-state imaging device 1 via the lens unit 2 into an image signal. The solid-state imaging device 1 will be described in detail below.

The image signal processing device 3 performs processes, such as amplification of a signal, conversion into image data, various corrections, or compression of image data, on the image signal output from the solid-state imaging device 1. The image signal processing device 3 uses a memory (not shown) as a temporary storage unit that stores image data in each process.

The recording device 4 is a recording medium such as a semiconductor memory that can be detachably mounted, and records and reads the image data.

The display device 6 is a display device such as a liquid crystal device that displays an image based on the image data made from an image formed in the solid-state imaging device 1 and processed by the image signal processing device 3 or the image data read from the recording device 4.

The camera control device 5 is a control device that controls the entire digital camera 7.

First Embodiment

Figure 2:
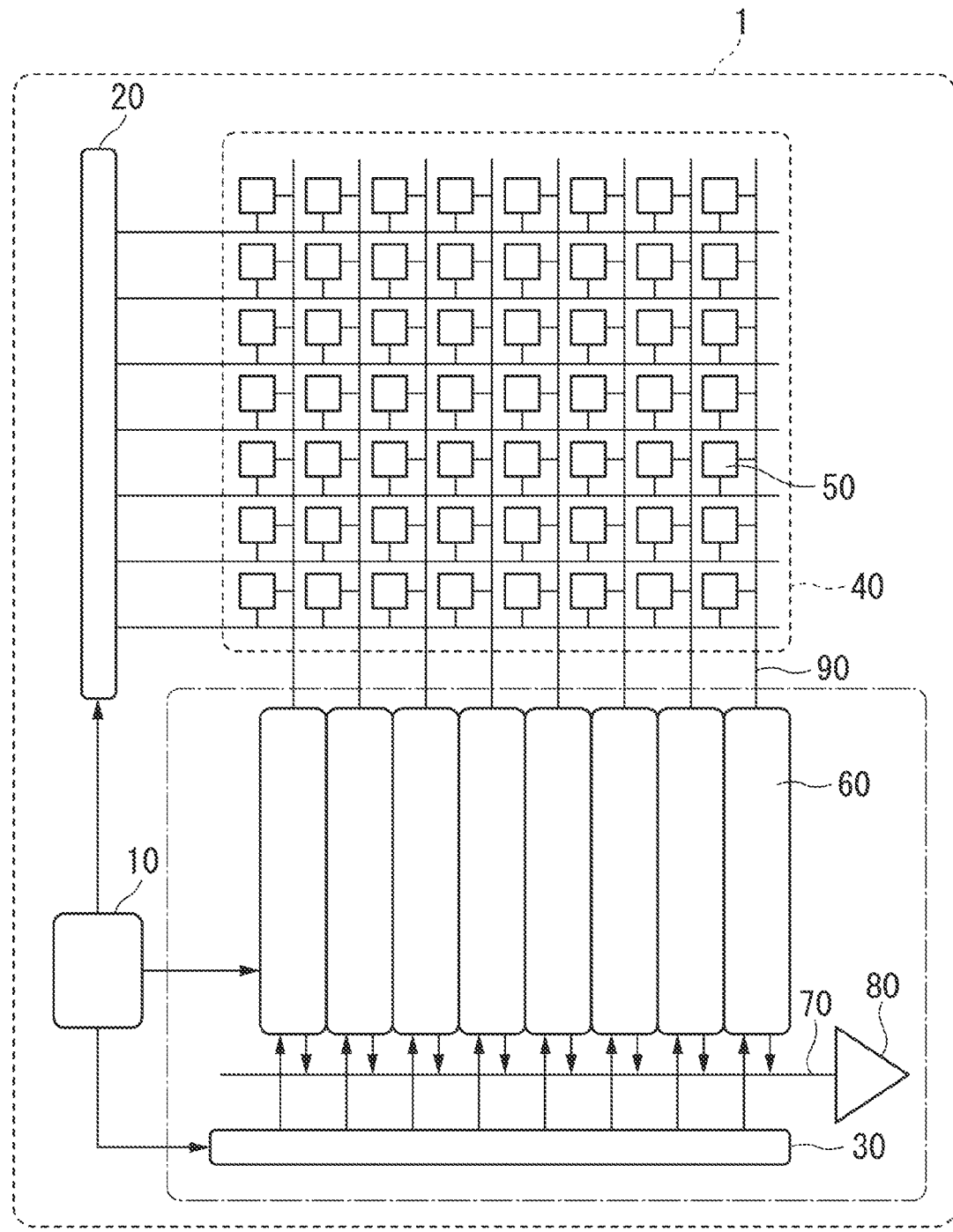
FIG. 2 is a block diagram illustrating a general configuration of a solid-state imaging device according to a first embodiment of the invention.

Next, the solid-state imaging device 1 mounted on the digital camera 7 will be described according to a first embodiment. FIG. 2 is a block diagram illustrating a general configuration of the solid-state imaging device 1 according to the first embodiment. In FIG. 2, the solid-state imaging device 1 includes a solid-state imaging device control signal generation circuit 10, a vertical read circuit 20, a horizontal read circuit 30, a pixel array unit 40 including a plurality of unit pixels 50, column signal processing circuits 60, and an output amplifier 80.

The solid-state imaging device 1 shown in FIG. 2 includes, for example, the pixel array unit 40 in which the plurality of unit pixels 50 are arrayed two-dimensionally in seven rows and eight columns. In the solid-state imaging device 1 shown in FIG. 2, the column signal processing circuits 60, the horizontal read circuit 30, and the output amplifier 80 are configured as signal processing circuits.

The solid-state imaging device control signal generation circuit 10 controls the vertical read circuit 20, the horizontal read circuit 30, and the column signal processing circuit 60.

The vertical read circuit 20 controls each unit pixel 50 in the pixel array unit 40 under the control of the solid-state imaging device control signal generation circuit 10 and outputs a pixel signal of each unit pixel 50 to a vertical signal line 90. The vertical read circuit 20 outputs a control signal used to control the unit pixels 50 to each row of the unit pixels 50 arrayed in the pixel array unit 40.

Each unit pixel 50 in the pixel array unit 40 converts incident subject light into a pixel signal and outputs the pixel signal appropriate to the incident subject light to the vertical signal line 90 according to the control signal input from the vertical read circuit 20. The unit pixel 50 will be described in detail below.

The column signal processing circuit 60 is a processing circuit that is disposed in each column of the pixel array unit 40 and performs a process such as a correlated double sampling (CDS) process of suppressing noise from the pixel signal output by the unit pixels 50 of each column to each vertical signal line 90 under the control of the solid-state imaging device control signal generation circuit 10. The column signal processing circuit 60 outputs an output signal obtained by performing a process on the pixel signal to the horizontal signal line 70 under the control of the horizontal read circuit 30. The column signal processing circuit 60 will be described in detail below.

The horizontal read circuit 30 sequentially reads, to the horizontal signal line 70, the output signals processed and output from the column signal processing circuits 60 which are each disposed in each column. The signals output from the column signal processing circuits 60 and read to the horizontal signal line 70 are output to the outside of the solid-state imaging device 1 via the output amplifier 80.

Figure 3:
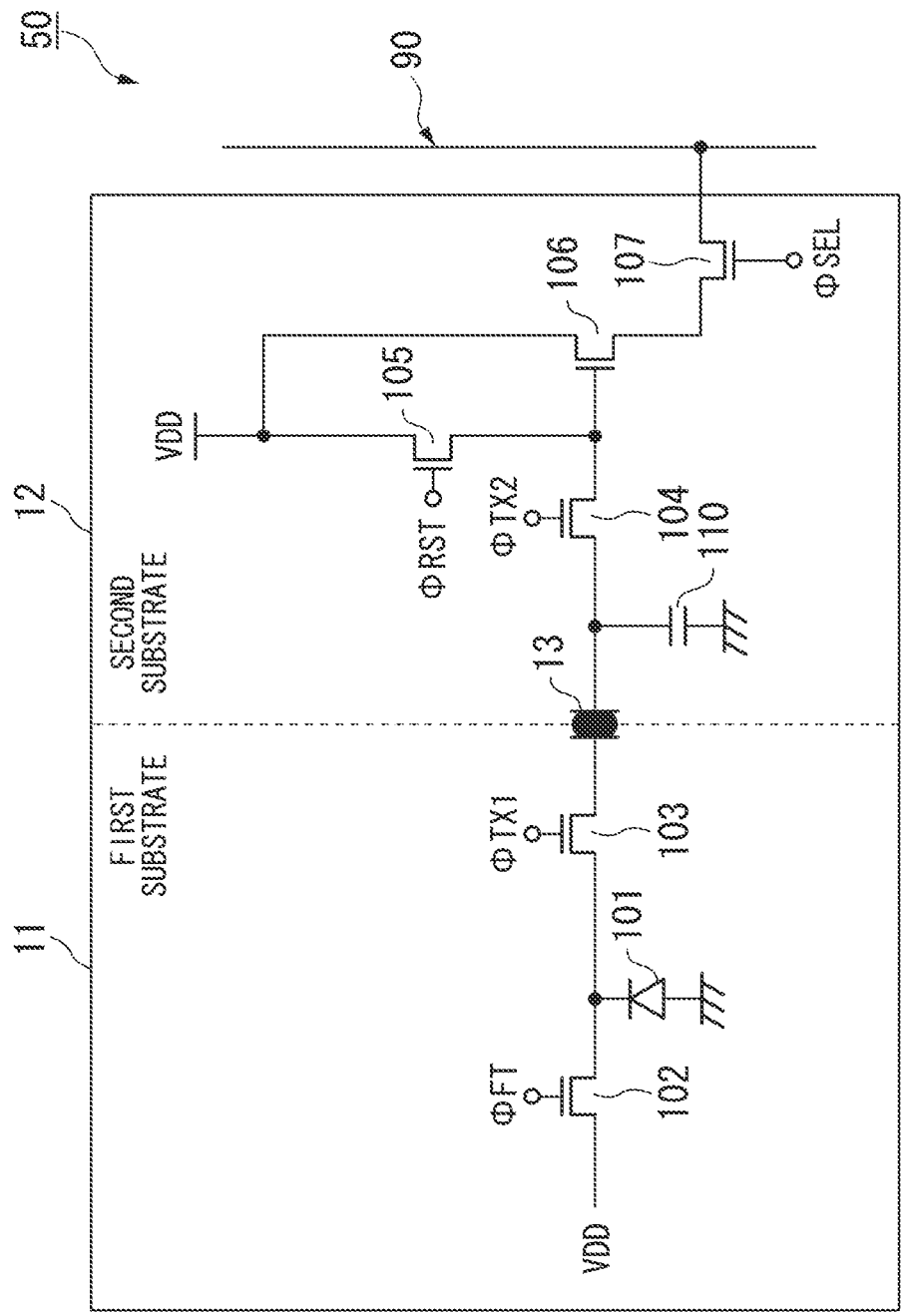
FIG. 3 is a circuits diagram illustrating a general configuration of a unit pixel in a pixel array unit of the solid-state imaging device according to the first embodiment.

Next, the unit pixel 50 arrayed in the pixel array unit 40 of the solid-state imaging device 1 according to the first embodiment will be described. FIG. 3 is a circuit diagram illustrating a general configuration of the unit pixel 50 in the pixel array unit 40 of the solid-state imaging device 1 according to the first embodiment. In FIG. 3, one unit pixel 50 is shown. The unit pixel 50 converts incident subject light into a pixel signal and outputs the converted pixel signal to the vertical signal line 90. The general configuration of the unit pixel 50 shown in FIG. 3 is the same as the configuration of a unit pixel in a solid-state imaging device according to the related art. However, in the solid-state imaging device 1 according to the first embodiment, as shown in FIG. 3, constituent elements of each unit pixel 50 are distributed and disposed in the pixel unit 11 of the first substrate and the pixel unit 12 of the second substrate.

In FIG. 3, the unit pixel 50 includes a photoelectric conversion unit 101, a photoelectric conversion unit reset transistor 102, and a first transfer transistor 103 formed in the pixel unit 11 of the first substrate, and includes a second transfer transistor 104, a pixel reset transistor 105, a first amplification transistor 106, a selection transistor 107, and a charge storage unit 110 formed in the pixel unit 12 of the second substrate. The pixel unit 11 of the first substrate and the pixel unit 12 of the second substrate are connected via the inter-substrate connector 13.

The inter-substrate connector 13 is a connector that electrically connects the first and second substrates to each other. As the inter-substrate connector 13, a bump or the like manufactured by, for example, a deposition method or a plating method is used.

A space between the first and second substrates may be filled with an insulation member such as an adhesive. The first and second substrates transmit and receive signals via the inter-substrate connector 13. In the unit pixel 50 shown in FIG. 3, the first transfer transistor 103 in the pixel unit 11 of the first substrate is connected to the second transfer transistor 104 and the charge storage unit 110 in the pixel unit 12 of the second substrate via the inter-substrate connector 13.

The photoelectric conversion unit 101 photoelectrically converts incident light to generate a signal charge and stores the signal charge as a photoelectric conversion signal. The first transfer transistor 103 transfers the photoelectric conversion signal stored in the photoelectric conversion unit 101 to the charge storage unit 110 via the inter-substrate connector 13 according to a control signal ΦTX1 input from the vertical read circuit 20. The charge storage unit 110 is a capacitor that retains (stores) the photoelectric conversion signal. The photoelectric conversion signal transferred by the first transfer transistor 103 is stored in the charge storage unit 110.

The second transfer transistor 104 transfers the photoelectric conversion signal retained (stored) in the charge storage unit 110 to a gate terminal of the first amplification transistor 106 according to a control signal ΦTX2 input from the vertical read circuit 20. The first amplification transistor 106 outputs a signal voltage appropriate to the photoelectric conversion signal transferred to the gate terminal. The selection transistor 107 outputs the signal voltage output by the first amplification transistor 106 as a pixel signal output by the unit pixel 50 to the vertical signal line 90 according to a control signal ΦSEL input from the vertical read circuit 20.

The photoelectric conversion unit reset transistor 102 resets the photoelectric conversion unit 101 to a power supply voltage VDD according to a control signal ΦFT input from the vertical read circuit 20. The pixel reset transistor 105 resets a signal in the unit pixel 50 to the power supply voltage VDD according to a control signal ΦRST input from the vertical read circuit 20.

In the solid-state imaging device 1, the vertical read circuit 20 realizes the global shutter function by simultaneously controlling all of the unit pixels 50. More specifically, the vertical read circuit 20 causes the photoelectric conversion units 101 of all the unit pixels 50 to simultaneously start the photoelectric conversion by simultaneously outputting the control signals ΦFT of all the unit pixels 50. Then, after a predetermined exposure time has elapsed, the vertical read circuit 20 simultaneously outputs the control signals ΦTX1 of all the unit pixels 50, and simultaneously transfers and retains the photoelectric conversion signals stored by the photoelectric conversion units 101 of all the unit pixels 50 to and in the charge storage units 110.

Thereafter, in the solid-state imaging device 1, the vertical read circuit 20 sequentially controls the unit pixels 50 for each row and outputs the pixel signals photoelectrically converted by the unit pixels 50 to the vertical signal lines 90. More specifically, the vertical read circuit 20 sequentially outputs (reads) the photoelectric conversion signals retained in the charge storage units 110 as the pixel signals to the vertical signal lines 90 by controlling the control signal ΦTX2, the control signal ΦRST, and the control signal ΦSEL for each row of the unit pixels 50. Since each unit pixel 50 includes the charge storage unit 110, the quality of a signal is prevented from deteriorating due to noise caused by leakage or the like occurring until the reading from each unit pixel 50.

Figure 4:
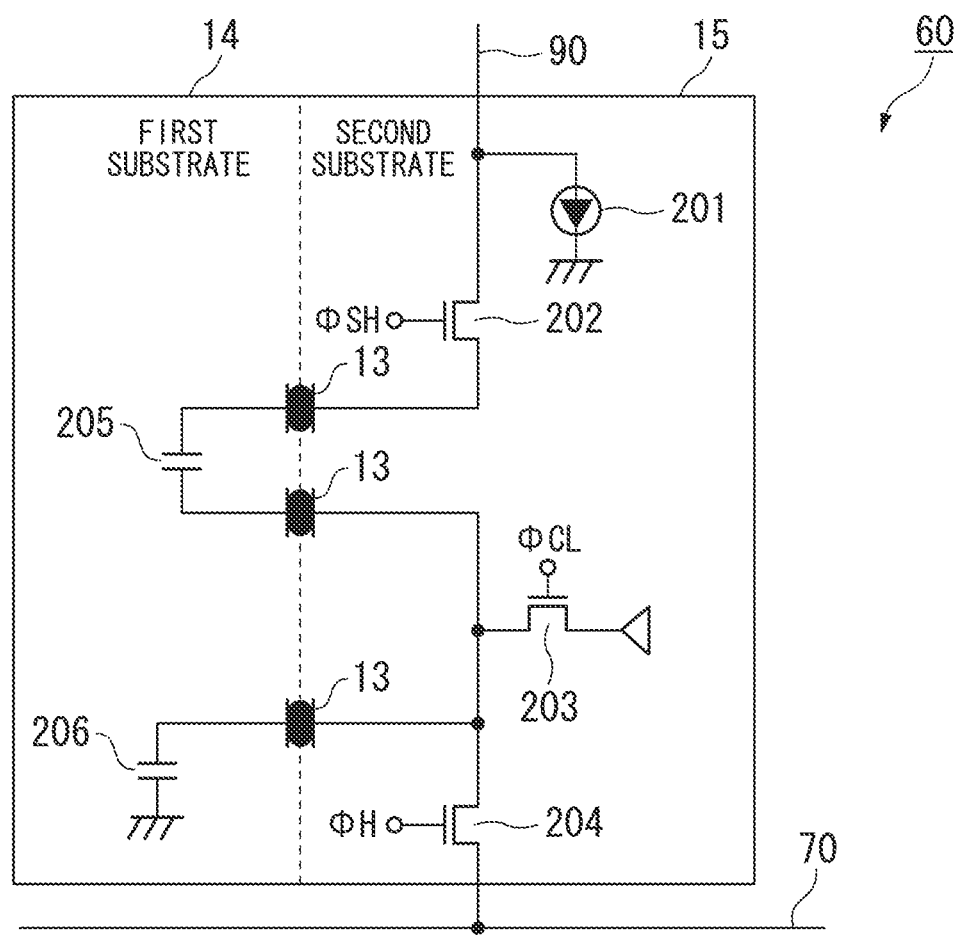
FIG. 4 is a circuits diagram illustrating a general configuration of a column signal processing circuits in the solid-state imaging device according to the first embodiment.

Next, the column signal processing circuit 60 in the solid-state imaging device 1 according to the first embodiment will be described. FIG. 4 is a circuit diagram illustrating a general configuration of a column signal processing circuit 60 in the solid-state imaging device 1 according to the first embodiment. FIG. 4 shows the column signal processing circuit 60 disposed in one row of the pixel array unit 40. The column signal processing circuit 60 performs a process such as a process of suppressing noise from a pixel signal output to the vertical signal line 90 by the unit pixel 50 and outputs the processed output signal to the horizontal signal line 70.

The general configuration of the column signal processing circuit 60 shown in FIG. 4 is the same as the configuration of a column signal processing circuit of a solid-state imaging device according to the related art. However, in the solid-state imaging device 1 according to the first embodiment, as shown in FIG. 4, constituent elements of each column signal processing circuit 60 are distributed and disposed in a column signal processing region 14 of the first substrate and a column signal processing region 15 of the second substrate.

In FIG. 4, the column signal processing circuit 60 includes a pixel current source 201, a sample and hold transistor 202, a clamp transistor 203, and a horizontal read transistor 204 formed in the column signal processing region 15 of the second substrate and includes a clamp capacitor 205 and a sample and hold capacitor 206 formed in the column signal processing region 14 of the first substrate. Further, the column signal processing region 14 of the first substrate and the column signal processing region 15 of the second substrate are connected to each other via the inter-substrate connector 13, as in the connection between the pixel unit 11 of the first substrate and the pixel unit 12 of the second substrate in the unit pixel 50 shown in FIG. 3.

Since the inter-substrate connector 13 is the same connector as the inter-substrate connector 13 that electrically connects the first and second substrates to each other, as in FIG. 3, the detailed description will not be repeated. In the column signal processing circuit 60 shown in FIG. 4, one terminal of the clamp capacitor 205 in the column signal processing region 14 of the first substrate is connected to one terminal of the sample and hold transistor 202 in the column signal processing region 15 of the second substrate via the inter-substrate connector 13. Further, the other terminal of the clamp capacitor 205 in the column signal processing region 14 of the second substrate is connected to one terminal of the clamp transistor 203 and one terminal of the horizontal read transistor 204 in the column signal processing region 15 of the second substrate via the inter-substrate connector 13. Furthermore, one terminal of the sample and hold capacitor 206 in the column signal processing region 14 of the first substrate is connected to the inter-substrate connector 13, which connects the one terminal of the clamp transistor 203 and the one terminal of the horizontal read transistor 204 in the column signal processing region 15 of the second substrate to the other terminal of the clamp capacitor 205 in the column signal processing region 14 of the first substrate, via the inter-substrate connector 13.

The pixel current source 201 is a load current source of the unit pixel 50 connected to the vertical signal line 90. The clamp transistor 203 clamps the sample and hold capacitor 206 and the clamp capacitor 205 to a fixed potential according to a control signal ΦCL input from the solid-state imaging device control signal generation circuit 10. Thus, the sample and hold capacitor 206 and the clamp capacitor 205 hold the clamped fixed potential.

The sample and hold transistor 202 switches connection between the vertical signal line 90 and the column signal processing circuit 60 and causes the sample and hold capacitor 206 to hold the signal according to a control signal ΦSH input from the solid-state imaging device control signal generation circuit 10. The horizontal read transistor 204 reads, to the horizontal signal line 70, the signal held in the sample and hold capacitor 206 according to a control signal ΦH input from the horizontal read circuit 30.

Hereinafter, an operation of the column signal processing circuit 60 will be described. First, the clamp capacitor 205 holds a potential (hereinafter referred to as a "noise potential") that is a difference between the fixed potential and a reset potential of the pixel signal of the unit pixel 50 input via the sample and hold transistor 202.

Thereafter, when the potential of the pixel signal of the unit pixel 50 input via the sample and hold transistor 202 is changed from the reset potential to a signal potential, the clamp capacitor 205 outputs a potential that is a difference between the noise potential and the signal potential. The potential that is a difference between the noise potential and the signal potential is a potential (hereinafter referred to as a "noise suppression potential") used to suppress noise when the unit pixel 50 is reset. Then, the sample and hold capacitor 206 holds the noise suppression potential output from the clamp capacitor 205.

Due to such an operation, a differential process between the reset potential and the signal potential of the unit pixel 50 can be performed, and thus it is possible to suppress a noise component included in the pixel signal output from the unit pixel 50. Only a capacitance ratio between the clamp capacitor 205 and the sample and hold capacitor 206 affects the output voltage of the noise suppression potential output by the column signal processing circuit 60. In the column signal processing circuit 60, as shown in FIG. 4, only the clamp capacitor 205 and the sample and hold capacitor 206 are formed in the column signal processing region 14 of the first substrate. Therefore, even in the lamination configuration of the first and second substrates, it is possible to suppress variability of a processing capability such as noise suppression in the column signal processing circuit 60.

Next, the connection between the first and second substrates of the solid-state imaging device 1 according to the first embodiment will be described. FIGS. 5A and 5B are diagrams illustrating the overview of the connection configuration of the substrates of the solid-state imaging device 1 according to the first embodiment. FIG. 5A is a side view illustrating the connection configuration of the first and second substrates of the solid-state imaging device 1. FIG. 5B is a top view illustrating the connection configuration of the first and second substrates of the solid-state imaging device 1. FIGS. 6A and 6B are diagrams schematically illustrating an example of disposition of the inter-substrate connector 13 in the solid-state imaging device 1 according to the first embodiment. FIG. 6A is a side view illustrating the disposition of the inter-substrate connector 13 between the first and second substrates of the solid-state imaging device 1. FIG. 6B is a top view illustrating the disposition of the inter-substrate connector 13 between the first and second substrates of the solid-state imaging device 1.

Figure 10B:
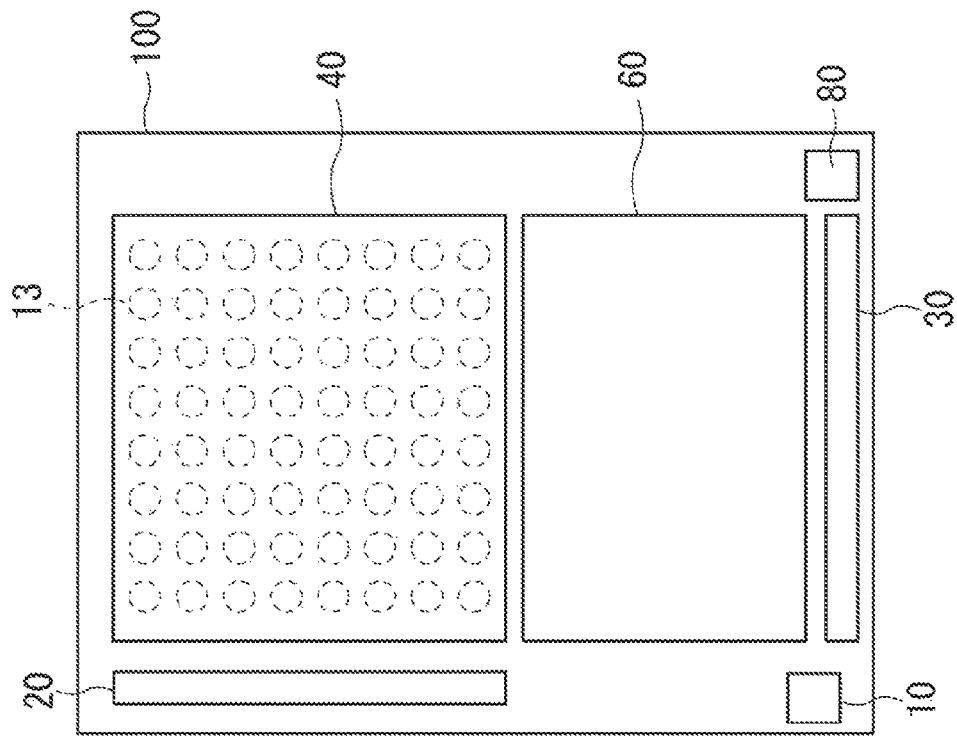
FIG. 10B is diagram illustrating an overview of a connection configuration of substrates of a solid-state imaging device according to the related art.
Figure 10A:
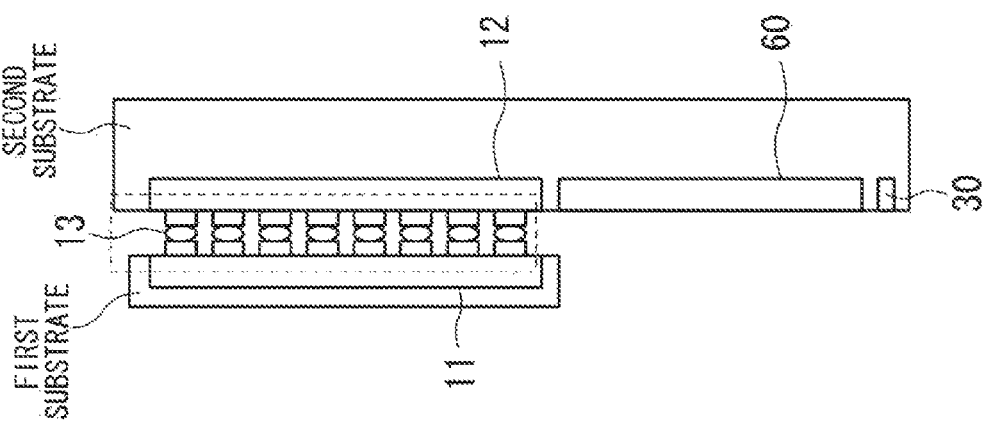
FIG. 10A is diagram illustrating an overview of a connection configuration of substrates of a solid-state imaging device according to the related art.

In the solid-state imaging device 1, as shown in FIGS. 5A and 5B, the unit pixels 50 in the pixel array unit 40 are distributed and formed in the pixel unit 11 of the first substrate and the pixel unit 12 of the second substrate. The lamination configuration of the first and second substrates is realized and the substrates are connected to each other via the inter-substrate connector 13. Thus, in the solid-state imaging device 1, it is possible to suppress the increase in the chip area of the first substrate, that is, the increase in the chip area of the pixel array unit 40 and prevent a signal quality from deteriorating due to the noise caused by light during the waiting period until reading the signal charges stored in the charge storage units 110 in the unit pixels 50, as in the solid-state imaging device 100 of the related art shown in FIGS. 10A and 10B.

In the solid-state imaging device 1, the column signal processing circuits 60 are distributed and formed in the column signal processing region 14 of the first substrate and the column signal processing region 15 of the second substrate, so that the first and second substrates are laminated. Thus, the chip area of the second substrate can be reduced in the solid-state imaging device 1 more than in the solid-state imaging device 100 of the related art shown in FIGS. 10A and 10B. Therefore, the chip area (mounting area) of the solid-state imaging device 1 can be reduced after the first and second substrates are connected to each other.

In the connection between the column signal processing region 14 of the first substrate and the column signal processing region 15 of the second substrate, for example, the disposition positions of the inter-substrate connector 13 can also be changed every column of the pixel array unit 40, as shown in FIGS. 6A and 6B. Thus, a connection pitch between two adjacent inter-substrate connector 13 can be widened by changing the disposition of the inter-substrate connector 13. Therefore, it is possible to suppress reduction in a yield ratio when the first and second substrates are connected to each other.

Further, since the connection pitch between the inter-substrate connector 13 is widened, the size of each inter-substrate connector 13 can also be increased. Thus, by reducing resistant components in the inter-substrate connector 13, it is possible to suppress reduction in an operation speed caused due to the distribution of the column signal processing circuits 60 into the first and second substrates.

In the solid-state imaging device 1 according to the first embodiment, as described above, the unit pixels 50 in the pixel array unit 40 and the column signal processing circuits 60 are distributed and formed in the first and second substrates. Thus, as understood from FIGS. 5A and 5B, a difference between the sizes of the first and second substrates can be reduced.

Since the first and second substrates of the solid-state imaging device 1 according to the first embodiment are separately manufactured, the first and second substrates can be manufactured by different semiconductor processes or using different numbers of manufacturing masks. In this case, the second substrate that includes signal processing circuits configured as the horizontal read circuit 30, the output amplifier 80, and some circuits of the column signal processing circuits 60 other than the clamp capacitors 205 and the sample and hold capacitors 206 which are capacitor elements (passive elements) in the column signal processing circuits 60 are preferably manufactured by a semiconductor process of realizing more detailed fabrication. This manufacturing process can be easily achieved, since only the capacitor elements used in the column signal processing circuits 60 are formed in the first substrate. Thus, by realizing the manufacturing process suitable for each of the first and second substrates, the cost of the solid-state imaging device 1 can be reduced.

In the solid-state imaging device 1 according to the first embodiment, the case in which the column signal processing circuits 60 are distributed and formed in the first and second substrates has been described. However, the constituent elements distributed and formed in the first and second substrates in the solid-state imaging device 1 are not limited to the constituent elements of the configuration according to the first embodiment. For example, circuits of the constituent elements may be distributed and formed in the first and second substrates in consideration of the signal processing circuits configured as the column signal processing circuits 60, the horizontal read circuit 30, and the output amplifier 80 and all the circuit configurations (also including capacitor elements serving as passive elements and other circuits) including the solid-state imaging device control signal generation circuit 10 and the vertical read circuit 20. Thus, the sizes of the first and second substrates can be adjusted to be identical to each other. Accordingly, the chip area (mounting area) of the solid-state imaging device 1 can be further reduced after the first and second substrates are connected to each other.

By configuring the sizes of the first and second substrates to be identical or similar to each other, the connection of the first and second substrates at the time of manufacturing the solid-state imaging device 1 can be realized in a wafer state. Further, manufacturing processes of thinning the substrates and forming color filters, micro-lenses or the like can be performed in the wafer state. Thus, the manufacturing cost of the solid-state imaging device 1 can be reduced more than that of the solid-state imaging device 100 of the related art shown in FIGS. 10A and 10B.

In the solid-state imaging device 1 according to the first embodiment, the case in which the clamp capacitor 205 and the sample and hold capacitor 206 in the column signal processing circuit 60 are disposed in the column signal processing region 15 of the second substrate has been described. However, the substrate in which the clamp capacitor 205 and the sample and hold capacitor 206 are disposed is not limited to the configuration described in the first embodiment. For example, one of the clamp capacitor 205 and the sample and hold capacitor 206 may be disposed in the column signal processing region 14 of the first substrate and the other of the clamp capacitor 205 and the sample and hold capacitor 206 may also be disposed in the column signal processing region 15 of the second substrate. In this case, the disposition positions of the clamp capacitor 205 and the sample and hold capacitor 206 are preferably determined in consideration of other factors such as an operation speed of the column signal processing circuits 60.

Second Embodiment

Next, a solid-state imaging device mounted on the digital camera 7 will be described according to a second embodiment.

The solid-state imaging device according to the second embodiment includes the same constituent elements as the solid-state imaging device 1 according to the first embodiment, except that the column signal processing circuit 60 in the solid-state imaging device 1 shown in FIG. 2 in the first embodiment is merely different. Accordingly, the same reference numerals are given to the constituent elements of the solid-state imaging device of the second embodiment which are the same as the constituent elements of the solid-state imaging device 1 shown in FIG. 2 in the first embodiment, and the detailed description will not be repeated here.

Figure 7:
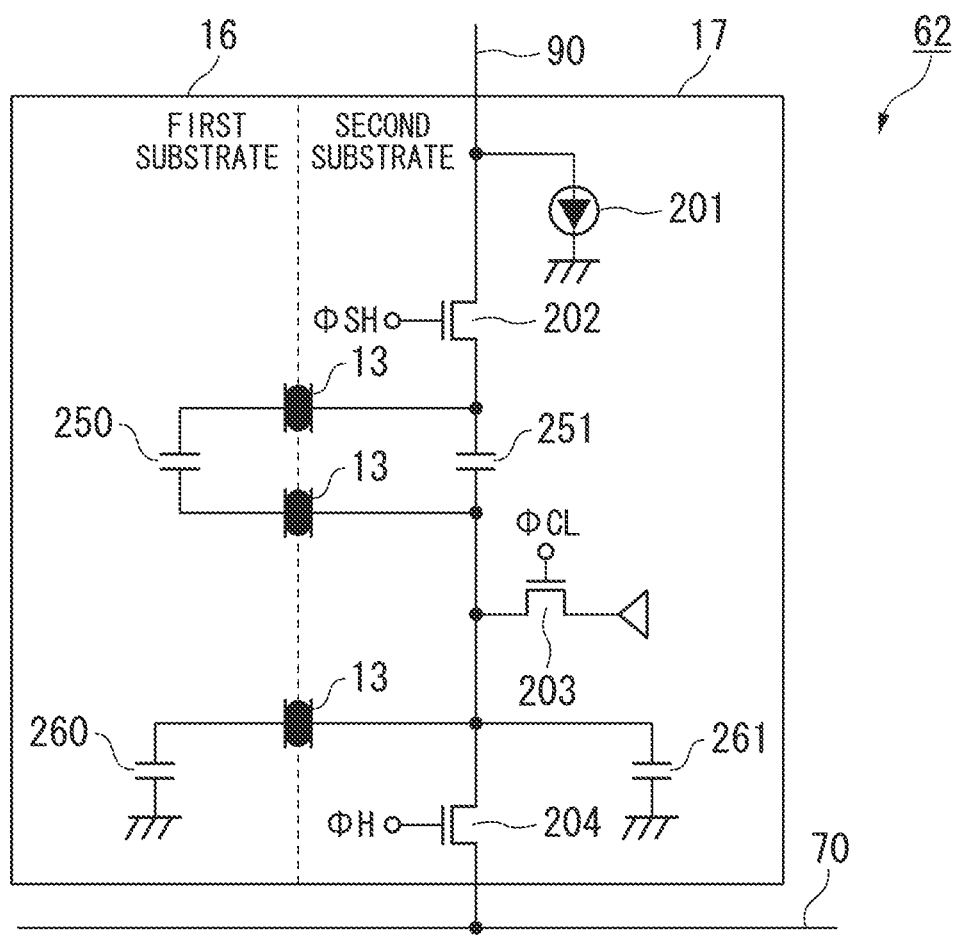
FIG. 7 is a circuits diagram illustrating a general configuration of a column signal processing circuits in the solid-state imaging device according to a second embodiment of the invention.

FIG. 7 is a circuit diagram illustrating a general configuration of a column signal processing circuit 62 in the solid-state imaging device according to a second embodiment. As in the column signal processing circuit 60 shown in FIG. 4, the column signal processing circuit 62 is a processing circuit that is disposed in each column of the pixel array unit 40 and performs a process such as a CDS process of suppressing noise from the pixel signal output by the unit pixels 50 of each column to each vertical signal line 90 under the control of the solid-state imaging device control signal generation circuit 10. FIG. 7 shows the column signal processing circuit 62 disposed in one column of the pixel array unit 40. The column signal processing circuit 62 performs a process such as a process of suppressing noise from the pixel signal output to the vertical signal line 90 by the unit pixel 50 and outputs the processed output signal to the horizontal signal line 70.

The general configuration of the column signal processing circuit 62 shown in FIG. 7 is the same as the configuration of the column signal processing circuit 60 shown in FIG. 4. In the column signal processing circuit 62, however, the clamp capacitor 205 and the sample hold capacitor 206 included in the column signal processing circuit 60 shown in FIG. 4 are separated into clamp capacitors 250 and 251 and sample and hold capacitors 260 and 261, respectively.

As shown in FIG. 7, the clamp capacitor 250 and the sample and hold capacitor 260 are distributed and formed in the column signal processing region 14 of the first substrate, and the clamp capacitor 251 and the sample and hold capacitor 261 are distributed and formed in the column signal processing region 15 of the second substrate. That is, in the column signal processing circuit 62, the clamp capacitor 251 and the sample and hold capacitor 261, which are capacitor elements (passive elements) of the column signal processing circuit 62, are also disposed in the column signal processing region 15 of the second substrate. Since a process such as a process of suppressing noise in the column signal processing circuit 62 is the same as that of the column signal processing circuit 60 shown in FIG. 4, the detailed description will not be repeated here.

Even in the solid-state imaging device according to the second embodiment, as described above, the unit pixels 50 in the pixel array unit 40 and the column signal processing circuits 62 are distributed and formed in the first and second substrates, as in the solid-state imaging device 1 according to the first embodiment. Thus, it is possible to obtain the same advantages as those of the solid-state imaging device 1 according to the first embodiment.

In the solid-state imaging device according to the second embodiment, the clamp capacitor 251 and the sample and hold capacitor 261, which are capacitor elements (passive elements) used in the column signal processing circuit 62, are also formed in the second substrates. Therefore, examination or the like of an operation of the column signal processing circuit 62 can be performed only on the second substrate before the first and second substrates are connected to each other. Thus, for example, the solid-state imaging device including a chip of the second substrate determined to be defective through the process of examining only the second substrate is not examined after the first and second substrates are connected to each other. Therefore, the cost of the solid-state imaging device 1 can be further reduced by reducing the cost relevant to the examination of the solid-state imaging device after the connection between the first and second substrates. Further, the clamp capacitor 251 and the sample and hold capacitor 261 formed in the second substrate and the clamp capacitor 250 and the sample and hold capacitor 260 in the first substrate are allocated such that the areas in the first substrate are substantially the same as the areas in the second substrate.

Third Embodiment

Next, a solid-state imaging device mounted on the digital camera 7 will be described according to a third embodiment.

The solid-state imaging device according to the third embodiment has the same constituent elements as the solid-state imaging device 1 according to the first embodiment, except that the column signal processing circuit 60 in the solid-state imaging device 1 shown in FIG. 2 in the first embodiment is merely different. Accordingly, the same reference numerals are given to the constituent elements of the solid-state imaging device of the third embodiment which are the same as the constituent elements of the solid-state imaging device 1 shown in FIG. 2 in the first embodiment, and the detailed description will not be repeated here.

Figure 8:
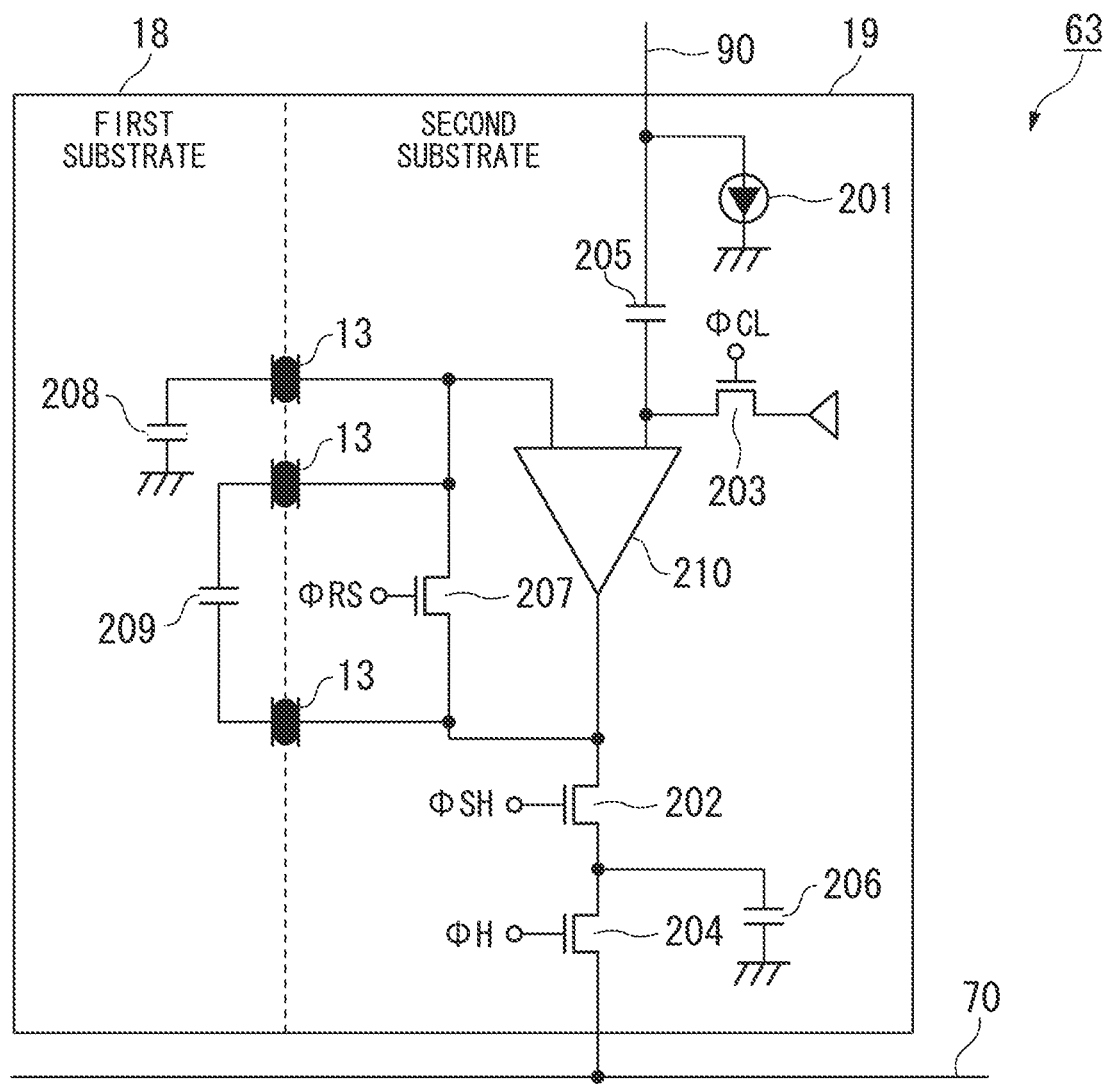
FIG. 8 is a circuits diagram illustrating a general configuration of a column signal processing circuits in the solid-state imaging device according to a third embodiment of the invention.

FIG. 8 is a circuit diagram illustrating a general configuration of a column signal processing circuit 63 in the solid-state imaging device according to a third embodiment. As in the column signal processing circuit 60 shown in FIG. 4, the column signal processing circuit 63 is a processing circuit that is disposed in each column of the pixel array unit 40 and performs a process such as a CDS process of suppressing noise from the pixel signal output by the unit pixels 50 of each column to each vertical signal line 90 under the control of the solid-state imaging device control signal generation circuit 10. FIG. 8 shows the column signal processing circuit 63 disposed in one column of the pixel array unit 40. The column signal processing circuit 63 performs a process such as a process of suppressing noise from the pixel signal output to the vertical signal line 90 by the unit pixel 50 and outputs a signal obtained by amplifying the processed output signal to the horizontal signal line 70.

The general configuration of the column signal processing circuit 63 shown in FIG. 8 is the same as the configuration of the column signal processing circuit having an amplification function in the solid-state imaging device according to the related art. In the solid-state imaging device according to the third embodiment, as shown in FIG. 8, the constituent elements in each column signal processing circuit 63 are distributed and disposed in the column signal processing region 18 of the first substrate and the column signal processing region 19 of the second substrate. In the following description, the same reference numerals are given to the same constituent elements of the column signal processing circuit 63 as those of the column signal processing circuit 60 shown in FIG. 4.

In FIG. 8, the column signal processing circuit 63 includes a pixel current source 201, a sample and hold transistor 202, a clamp transistor 203, a horizontal read transistor 204, a clamp capacitor 205, a sample and hold capacitor 206, an amplifier reset transistor 207, and an amplifier circuit 210 formed in the column signal processing region 19 of the second substrate and includes an amplification capacitor 208 and a feedback capacitor 209 formed in the column signal processing region 18 of the first substrate. Further, the column signal processing region 18 of the first substrate and the column signal processing region 19 of the second substrate are connected to each other via the inter-substrate connector 13, as in the connection between the pixel unit 11 of the first substrate and the pixel unit 12 of the second substrate in the unit pixel 50 shown in FIG. 3. In the column signal processing circuit 63 shown in FIG. 8, the amplification capacitor 208, the feedback capacitor 209, and the amplifier circuit 210 form a non-inversion amplification circuit that amplifies the pixel signal of the unit pixel 50 input from the vertical signal line 90.

Since the inter-substrate connector 13 is the same connector as the inter-substrate connector 13 that electrically connects the first and second substrates to each other, as in FIG. 3, the detailed description will not be repeated here. In the column signal processing circuit 63 shown in FIG. 8, one terminal of the amplification capacitor 208 in the column signal processing region 18 of the first substrate is connected to one terminal of the amplifier reset transistor 207 and one input terminal of the amplifier circuit 210 in the column signal processing region 19 of the second substrate via the inter-substrate connector 13. Further, one terminal of the feedback capacitor 209 in the column signal processing region 18 of the first substrate is connected to the inter-substrate connector 13, which connects the one input terminal of the amplifier reset transistor 207 and the one input terminal of the amplifier circuit 210 in the column signal processing region 19 of the second substrate to the one terminal of the amplification capacitor 208 in the column signal processing region 18 of the first substrate via the inter-substrate connector 13. Furthermore, the other terminal of the feedback capacitor 209 in the column signal processing region 18 of the first substrate is connected to the other terminal of the amplifier reset transistor 207, one terminal of the sample and hold transistor 202, and an output terminal of the amplifier circuit 210 in the column signal processing region 19 of the second substrate via the inter-substrate connector 13.

The pixel current source 201 is a load current source of the unit pixel 50 connected to the vertical signal line 90. The clamp transistor 203 clamps the clamp capacitor 205 to a fixed potential according to a control signal ΦCL input from the solid-state imaging device control signal generation circuit 10. Thus, the clamp capacitor 205 holds the clamped fixed potential.

The amplifier reset transistor 207 resets the amplifier circuit 210 according to a control signal ΦRS input from the solid-state imaging device control signal generation circuit 10. The amplifier circuit 210 amplifies and outputs the clamped signal according to a ratio between the feedback capacitor 209 and the amplification capacitor 208.

The sample and hold transistor 202 holds the output amplified by the amplifier circuit 210 in the sample and hold capacitor 206 according to a control signal ΦSH input from the solid-state imaging device control signal generation circuit 10. The horizontal read transistor 204 reads, to the horizontal signal line 70, the signal held in the sample and hold capacitor 206 according to a control signal ΦH input from the horizontal read circuit 30.

Hereinafter, an operation of the column signal processing circuit 63 will be described. First, the clamp capacitor 205 holds a noise potential which is a potential that is a difference between and the fixed potential and a reset potential of the pixel signal of the unit pixel 50 output to the vertical signal line 90 by the unit pixel 50. Thereafter, when the potential of the pixel signal of the unit pixel 50 output to the vertical signal line 90 by the unit pixel 50 is changed from the reset potential to the signal potential, the clamp capacitor 205 outputs a noise suppression potential which is a potential that is a difference between the noise potential and the signal potential. Then, the sample and hold capacitor 206 holds the noise suppression potential amplified by the amplifier circuit 210.

Due to such an operation, a differential process between the reset potential and the signal potential of the unit pixel 50 and a process of amplifying a difference signal can be performed, and thus it is possible to suppress a noise component included in the pixel signal output from the unit pixel 50. Only a capacitance ratio between the amplification capacitor 208 and the feedback capacitor 209 affects the output voltage of the noise suppression potential output by the column signal processing circuit 63. In the column signal processing circuit 63, as shown in FIG. 8, only the amplification capacitor 208 and the feedback capacitor 209 are formed in the column signal processing region 18 of the first substrate. Therefore, even in the lamination configuration of the first and second substrates, it is possible to suppress variability of a processing capability such as noise suppression in the column signal processing circuit 63.

Even in the solid-state imaging device according to the third embodiment, as described above, the unit pixels 50 in the pixel array unit 40 and the column signal processing circuits 63 are distributed and formed in the first and second substrates, as in the solid-state imaging device 1 according to the first embodiment and the solid-state imaging device according to the second embodiment. Thus, it is possible to obtain the same advantages as those of the solid-state imaging device 1 according to the first embodiment and the solid-state imaging device according to the second embodiment. Further, in the solid-state imaging device according to the third embodiment, the amplified output signal subjected to the noise suppression can be obtained.

In the solid-state imaging device according to the third embodiment, only the amplification capacitor 208 and the feedback capacitor 209, which are capacitor elements (passive elements) used when the column signal processing circuit 63 amplifies the signal, are formed in the second substrate. Therefore, before the first and second substrates are connected to each other, an operation of the column signal processing circuit 63 can be examined only for the second substrate by controlling the amplifier reset transistor 207 to reset the amplifier circuit 210. Thus, as in the solid-state imaging device according to the second embodiment, the cost of the solid-state imaging device can be further reduced.

In the solid-state imaging device according to the third embodiment, the case in which the amplification capacitor 208 and the feedback capacitor 209 in the column signal processing circuit 63 are formed in the column signal processing region 18 of the first substrate has been described. However, the method of forming the amplification capacitor 208 and the feedback capacitor 209 is not limited to the configuration according to the third embodiment. For example, as in the clamp capacitors 250 and 251 and the sample and hold capacitors 260 and 261 in the column signal processing circuit 62 shown in FIG. 7, the amplification capacitor 208 and the feedback capacitor 209 may be separated and formed in the column signal processing region 18 of the first substrate and the column signal processing region 19 of the second substrate. For example, the clamp capacitor 205 and the sample and hold capacitor 206 in the column signal processing circuit 63 may be disposed in the column signal processing region 18 of the first substrate, as in the column signal processing circuit 60 shown in FIG. 4, or may be separated and disposed in the column signal processing region 18 of the first substrate and the column signal processing region 19 of the second substrate, as in the column signal processing circuit 62 shown in FIG. 7.

Fourth Embodiment

Next, a solid-state imaging device mounted on the digital camera 7 will be described according to a fourth embodiment.

The solid-state imaging device according to the fourth embodiment has the same constituent elements as the solid-state imaging device 1 according to the first embodiment, the solid-state imaging device according to the second embodiment, and the solid-state imaging device according to the third embodiment, except that the unit pixels 50 in the pixel array unit 40 of the solid-state imaging device 1 according to the first embodiment shown in FIG. 2 are merely different. Accordingly, the same reference numerals are given to the constituent elements of the solid-state imaging device of the fourth embodiment which are the same as the constituent elements of the solid-state imaging device 1 of the first embodiment shown in FIG. 2 in the fourth embodiment, and the detailed description will not be repeated here.

Figure 9:
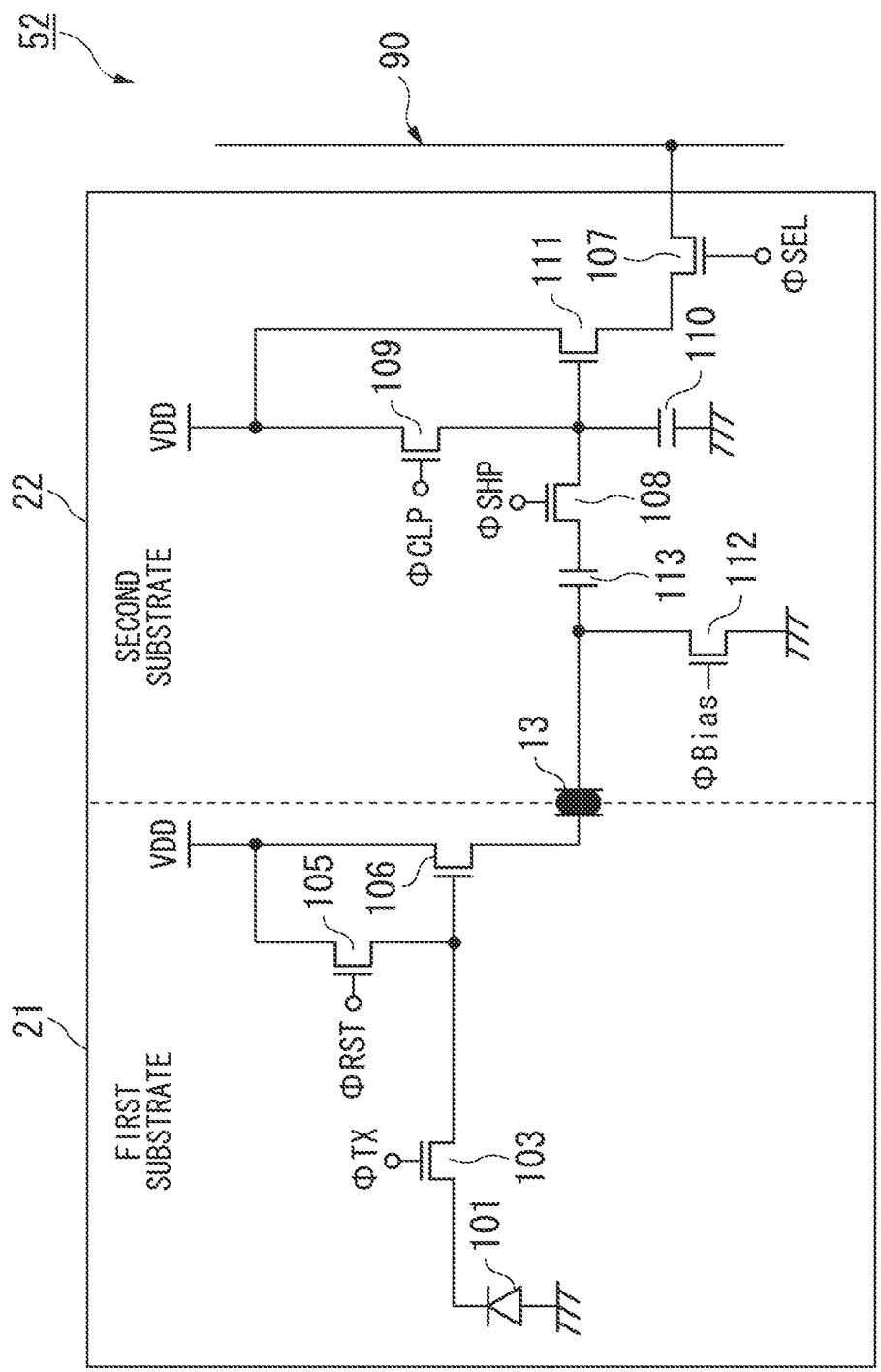
FIG. 9 is a circuits diagram illustrating a general configuration of a unit pixel in a pixel array unit of the solid-state imaging device according to a fourth embodiment of the invention.

FIG. 9 is a circuit diagram illustrating a general configuration of a unit pixel 52 in the pixel array unit 40 of the solid-state imaging device according to the fourth embodiment. As in the unit pixel 50 shown in FIG. 3, the unit pixel 52 converts incident subject light into a pixel signal and outputs the pixel signal appropriate to the incident subject light to the vertical signal line 90 according to a control signal input from the vertical read circuit 20. In FIG. 9, one unit pixel 52 is shown. In the following description, the same reference numerals are given to the constituent elements of the unit pixel 52 having the same functions as the constituent elements of the unit pixel 50 shown in FIG. 3.

In FIG. 9, the unit pixel 52 includes a photoelectric conversion unit 101, a first transfer transistor 103, a pixel reset transistor 105, and a first amplification transistor 106 formed in a pixel unit 21 of the first substrate and includes a selection transistor 107, an in-pixel sample and hold transistor 108, an in-pixel clamp transistor 109, a charge storage unit 110, a second amplification transistor 111, a first pixel load transistor 112, and an in-pixel clamp capacitor 113 formed in a pixel unit 22 of the second substrate. The pixel unit 21 of the first substrate and the pixel unit 22 of the second substrate are connected to each other via inter-substrate connector 13.

Since the inter-substrate connector 13 is a connector that electrically connects the first and second substrates to each other, as in the inter-substrate connector 13 shown in FIG. 3, the detailed description will not be repeated. In the unit pixel 52 shown in FIG. 9, the first amplification transistor 106 in the pixel unit 21 of the first substrate is connected to the first pixel load transistor 112 and the in-pixel clamp capacitor 113 in the pixel unit 22 of the second substrate via the inter-substrate connector 13.

The photoelectric conversion unit 101 photoelectrically converts incident light to generate a signal charge and stores the signal charge as a photoelectric conversion signal. The first transfer transistor 103 transfers the photoelectric conversion signal stored in the photoelectric conversion unit 101 to the gate terminal of the first amplification transistor 106 according to a control signal ΦTX input from the vertical read circuit 20. The first amplification transistor 106 outputs a signal voltage appropriate to the photoelectrically converted signal transferred to the gate terminal. The pixel reset transistor 105 resets the signal in the unit pixel 52 to a power supply voltage VDD according to a control signal ΦRST input from the vertical read circuit 20.

The first pixel load transistor 112 functions as a load of the first amplification transistor 106 according to a control signal ΦBias input from the vertical read circuit 20. The first pixel load transistor 112 supplies a current used to drive the first amplification transistor 106 to the first amplification transistor 106. The in-pixel clamp capacitor 113 is a capacitor that retains (stores) the signal voltage output from the first amplification transistor 106. The in-pixel clamp transistor 109 clamps the charge storage unit 110 and the in-pixel clamp capacitor 113 to a fixed potential according to a control signal FCLP input from the vertical read circuit 20. Thus, the charge storage unit 110 and the in-pixel clamp capacitor 113 hold the clamped fixed potential. The in-pixel sample and hold transistor 108 holds a signal in the charge storage unit 110 according to a control signal FSHP input from the vertical read circuit 20. The charge storage unit 110 is a capacitor that retains (stores) a signal voltage input via the in-pixel sample and hold transistor 108.

The unit pixel 52 includes the first pixel load transistor 112, the in-pixel clamp transistor 109, the in-pixel sample and hold transistor 108, the charge storage unit 110, and the in-pixel clamp capacitor 113, and thus a process of removing noise caused by leakage or the like is performed in the unit pixel 52. The charge storage unit 110 retains (stores) the signal subjected to the noise removing process. As the charge storage unit 110, a metal insulator metal (MIM) capacitor or a metal oxide semiconductor (MOS) capacitor, which is a capacitor in which a leakage current (dark current) per unit area is small, is more preferably used. Thus, since resistance against noise is improved, a high-quality signal can be obtained.

The second amplification transistor 111 outputs a signal voltage of the gate terminal, that is, a signal voltage appropriate to the signal subjected to the noise removing process and stored in the charge storage unit 110. The selection transistor 107 outputs the signal voltage output by the second amplification transistor 111 as a pixel signal output by the unit pixel 52 to the vertical signal line 90 according to a control signal ΦSEL input from the vertical read circuit 20.

In the solid-state imaging device according to the fourth embodiment, the vertical read circuit 20 realizes the global shutter function by simultaneously controlling all of the unit pixels 52. More specifically, the vertical read circuit 20 causes the photoelectric conversion units 101 of all the unit pixels 52 to simultaneously start the photoelectric conversion by simultaneously outputting the control signals ΦRST and the control signal ΦTX of all the unit pixels 52. Then, after a predetermined exposure time has elapsed, the vertical read circuit 20 simultaneously outputs the control signals ΦTX of all the unit pixels 52, and simultaneously transfers the photoelectric conversion signals stored by the photoelectric conversion units 101 of all the unit pixels 52 to the gate terminals of the first amplification transistors 106. At this time, the vertical read circuit 20 simultaneously performs the photoelectric conversion signal amplifying process and the noise removing process by simultaneously controlling the control signal FSHP, the control signal FCLP, the control signal ΦBias, and the control signal ΦRST of all the unit pixels 52, and then sequentially holds the signals from which noise is removed in the charge storage unit 110.

Thereafter, in the solid-state imaging device according to the fourth embodiment, the vertical read circuit 20 photoelectrically converts the unit pixels 52 by sequentially controlling the unit pixels 52 for each row and outputs the pixel signals from which noise is removed to the vertical signal lines 90. More specifically, the vertical read circuit 20 sequentially outputs (reads) the photoelectric conversion signals subjected to the noise removing process and respectively retained in the charge storage units 110 as the pixel signals to the vertical signal lines 90 by controlling the control signal FCLP and the control signal ΦSEL for each row of the unit pixels 52. Since each unit pixel 52 includes the charge storage unit 110 and the charge storage unit 110 holds the amplified signal from which noise is removed, the quality of a signal is prevented from deteriorating due to noise caused by leakage or the like occurring until the reading from each unit pixel 52 more than the unit pixels 50 shown in FIG. 3.

As described above, in the solid-state imaging device according to the fourth embodiment, it is possible to prevent a signal quality from deteriorating due to noise caused by light during a waiting period until reading the signal charges stored in the charge storage units 110, leakage of the storage capacitance, or the like in each unit pixel 52. Thus, through combination with, for example, the process of suppressing noise by the column signal processing circuit, it is possible to obtain a higher-quality image. Further, even in the solid-state imaging device according to the fourth embodiment, the unit pixels 52 in the pixel array unit 40 and the column signal processing circuits are distributed and formed in the first and second substrates, as in the solid-state imaging device 1 according to the first embodiment, the solid-state imaging device according to the second embodiment, and the solid-state imaging device according to the third embodiment. Thus, it is possible to obtain a high-quality image. Further, it is possible to provide the solid-state imaging device in which the reduction in the chip area (mounting area) of the solid-state imaging device and the reduction in the cost are realized.

According to the embodiment of the invention, as described above, the unit pixels 52 in the pixel array unit 40 of the solid-state imaging device and the column signal processing circuits are distributed and formed in the first and second substrates. Thus, a difference between the sizes of the first and second substrates of the solid-state imaging device can be reduced. Accordingly, since a process of manufacturing the solid-state imaging device can be performed in a wafer state, the cost relevant to the manufacturing of the solid-state imaging device can be designed to be reduced.

According to the embodiment of the invention, the first and second substrates of the solid-state imaging device are separately manufactured. Therefore, a semiconductor process suitable for each of the first and second substrates can be used. Thus, the cost of the solid-state imaging device can be designed to be reduced.

According to the embodiment of the invention, since the signal processing circuits performing a process such as a process of reducing the noise are distributed and formed in the first and second substrates, the signal processing circuits can be realized in a smaller chip area (mounting area). Therefore, it is possible to realize the solid-state imaging device capable of obtaining a high-quality image.

A solid-state imaging device according to an aspect of the invention corresponds to, for example, the solid-state imaging device 1 according to the embodiment. An imaging device corresponds to, for example, the digital camera 7. The connector corresponds to, for example, the inter-substrate connector 13. A photoelectric conversion element according to an aspect of the invention corresponds to, for example, the photoelectric conversion unit 101 according to the embodiment. A read circuit corresponds to, for example, the first transfer transistor 103 or the second transfer transistor 104, and the selection transistor 107. Signal processing circuits correspond to, for example, the column signal processing circuit 60, the horizontal read circuit 30, and the output amplifier 80.

A pixel unit according to an aspect of the invention corresponds to, for example, the pixel array unit 40 according to the embodiment. A region of the pixel unit corresponds to, for example, the pixel unit 11 of the first substrate and the pixel unit 12 of the second substrate. The other region corresponds to, for example, the column signal processing region 14 of the first substrate and the column signal processing region 15 of the second substrate. Some of the elements or circuits included in the signal processing circuit according to an aspect of the invention correspond to, for example, the clamp capacitor 205 and the sample and hold capacitor 206 according to the embodiment. The remaining elements or circuits included in the signal processing circuits correspond to, for example, the pixel current source 201, the sample and hold transistor 202, the clamp transistor 203, and the horizontal read transistor 204.

A pixel according to an aspect of the invention corresponds to, for example, the unit pixel 50 or the unit pixel 52 according to the embodiment. An amplification circuit corresponds to, for example, the first amplification transistor 106. A load circuit corresponds to, for example, the first pixel load transistor 112. A signal storage circuit corresponds to, for example, the charge storage unit 110. A noise reduction circuit corresponds to, for example, the in-pixel sample and hold transistor 108 and the in-pixel clamp capacitor 113.

Passive elements according to an aspect of the invention correspond to, for example, the clamp capacitor 205, the sample and hold capacitor 206, the clamp capacitor 250, the clamp capacitor 251, the sample and hold capacitor 260, the sample and hold capacitor 261, the amplification capacitor 208, and the feedback capacitor 209 according to the embodiment. A noise signal reduction circuit according to an aspect of the invention corresponds to, for example, the column signal processing circuit 60 according to the embodiment. A signal amplification circuit and a signal amplification amplifier correspond to, for example, the amplifier circuit 210 or the output amplifier 80.

A transfer circuit and a transfer transistor according to an aspect of the invention correspond to, for example, the first transfer transistor 103 according to the embodiment. A first amplification circuit and a first amplification transistor correspond to, for example, the first amplification transistor 106. A first reset circuit and a first reset transistor correspond to, for example, the pixel reset transistor 105.

An analog memory circuit according to an aspect of the invention corresponds to, for example, the in-pixel clamp capacitor 113, the charge storage unit 110, and the in-pixel sample and hold transistor 108 according to the embodiment. A second amplification circuit and a second amplification transistor correspond to, for example, the second amplification transistor 111. A second reset circuit and a second reset transistor correspond to, for example, the in-pixel clamp transistor 109.

A specific configuration of the invention is not limited to the embodiments of the invention, but may be modified in various ways within the scope of the invention without departing from the gist of the invention. For example, in the embodiments of the invention, the case in which the pixel unit 11 of the first substrate and the pixel unit 12 of the second substrate are connected to each other for each unit pixel 50 has been described. The pixel unit 11 of the first substrate and the pixel unit 12 of the second substrate may be connected collectively in units of the plurality of unit pixels 50. For example, in the embodiments of the invention, the case in which the connection pitch between the inter-substrate connector 13 is widened by disposing the inter-substrate connector 13 in zigzags has been described. However, the connection pitch between the inter-substrate connector 13 may be widened by collecting the inter-substrate connector 13 in units of the plurality of columns of the pixel array unit 40 and shifting the disposition of the inter-substrate connector 13.

The specific configurations of the circuit configuration and the driving method according to the invention are not limited to the embodiments of the invention, but may be modified in various ways within the scope of the invention without departing from the gist of the invention. For example, even when the constituent elements of the pixels and the signal processing circuits and the method of driving these constituent elements are changed, the driving method may be modified so as to be suitable for the constituent elements or the circuit configuration of the solid-state imaging device, the unit pixel, or the column signal processing circuit.

The disposition of the pixels in the row direction and the column direction are not limited to the embodiments of the invention. The number of pixels disposed in the row direction and the column direction can be modified within the scope of the invention without departing from the gist of the invention.

The embodiments of the invention have been described, but any combination of the constituent elements and the processes and conversion from the expression of the invention to a computer program product or the like are useful as aspects of the invention. Here, the computer program product refers to a recording medium, a device, an apparatus, or a system, in which program codes are recorded, such as a recording medium (a DVD medium, a hard disk medium, a memory medium, or the like) in which the program codes are recorded, a computer in which the program codes are recorded, or an Internet system (for example, a system including a server and a client terminal) in which the program codes are recorded. In this case, each of the above constituent elements or each of the processes described above is mounted as a module and program codes formed from the mounted module are recorded in a computer program product.

For example, the computer program product according to an aspect of the invention is a computer program product in which program codes are recorded to cause a computer to execute the processes of the solid-state imaging device in which the first and second substrates are electrically connected to each other by the connector configured to electrically connect the first and second substrates to each other. Further, the computer program product is a computer program product in which program codes are recorded which include: a read module configured such that the signals generated by the photoelectric conversion elements disposed in the first substrate and transmitted via the connector are read by the read circuit disposed in the second substrate; and a signal processing module performing signal processing on a signal read by the read module by signal processing circuits configured such that some of the elements or circuits are disposed in the first substrate, the remaining elements or circuits are disposed in the second substrate, and the elements or circuits disposed in the first substrate are electrically connected to the elements or circuits disposed in the second substrate via the connector For example, the above-described various processes relevant to the digital camera 7 may be performed by recording a program configured to realize the process of each constituent element of the digital camera 7 shown in FIG. 1 in a computer-readable recording medium and reading the program recorded in the recording medium to a computer system to execute the program. The "computer system" mentioned here may include an OS or hardware such as a peripheral device. Further, the "computer system" is assumed to include a homepage providing environment (or a display environment), when the WWW system is used. The "computer-readable recording medium" refers to a storage device such as a non-volatile memory on which data can be written, such as a flexible disk, a magneto-optical disc, a ROM, or a flash memory, a portable medium such as a CD-ROM, or a hard disk included in a computer system.

Further, the "computer-readable recording medium" is assumed to include a medium which retains a program for a given time, such as a volatile memory (for example, a dynamic random access memory (DRAM)) included in a computer system configured by a server or a client when a program is transmitted via a network such as the Internet or a communication line such as a telephone line. The program may be transmitted from a computer system storing the program in a storage device or the like to another computer system via a transmission medium or by transmission waves in a transmission medium. Here, the "transmission medium" transmitting the program refers to a medium that has a function of transmitting information, such as a network (communication network) such as the Internet or a communication link (communication line) such as a telephone link. The above-described program may be a program configured to realize some of the above-described functions. Further, the program may be a so-called difference file (difference program) in which the above-described functions are realized by combination with a program already recorded in a computer system.

The embodiments of the invention have been described with reference to the drawings, but specific configurations are not limited to the embodiments. Various modifications are also included within the scope of the invention without departing from the gist of the invention.

The embodiments of the invention have been described with reference to the drawings, but specific configurations are not limited to the embodiments. Various substitutions, modifications, and equivalents are possible within the scope of the invention without departing from the gist of the invention. Accordingly, the scope of the invention is not determined with reference to the above description, but is determined by the claims and the entire scope of equivalents is also included. The above-described characteristics may be combined with other characteristics, irrespective of whether the characteristics are preferable. In the claims, one or more of each constituent element may be included, unless explicitly stated otherwise. The claims should not be construed as inclusion of the limitation of a means-plus-function unless a phrase such as "means for" is explicitly written in the claims.

In the solid-state imaging device according to the embodiments of the invention, two substrates may be connected to each other via the connector, or three or more substrates may be connected to the connector. In a solid-state imaging device in which three or more substrates are connected to each other via the connector, two of the substrates correspond to the first and second substrates according to the claims.

The preferred embodiments of the invention have been described, but the invention is not limited to these embodiments. Additions, omissions, substitutions, and other modifications of configurations may be made within the scope of the invention without departing from the gist of the invention. The invention is not limited to the above description, but is limited only by the appended claims.

What is claimed is:

1. A solid-state imaging device in which first and second substrates are electrically connected to each other via a connector, the solid-state imaging device comprising:
pixels include photoelectric conversion elements and read circuits that each read a signal generated by the photoelectric conversion elements;
signal processing circuits each include elements or circuits that perform signal processing on pixel signals outputted from the pixels; and
an output circuit that receives signals outputted from the signal processing circuits and outputs the received signals as an output signal of the solid-state imaging device,
wherein the photoelectric conversion elements of the pixels are disposed in the first substrate,
wherein the read circuits of the pixels are disposed in the second substrate and read the signals generated by the photoelectric conversion elements and transmitted via the connector, and
wherein, in each signal processing circuit, some of the elements or the circuits included in the signal processing circuit are disposed in the first substrate, rest of the elements or the circuits included in the signal processing circuit are disposed in the second substrate, and the elements or the circuits disposed in the first substrate are electrically connected to the elements or the circuits disposed in the second substrate via the connector.

2. The solid-state imaging device according to claim 1, wherein, in the first substrate, some of the elements or the circuits of each signal processing circuit are disposed in a region other than a region of a pixel unit in which the photoelectric conversion elements are disposed.

3. A solid-state imaging device in which first and second substrates are electrically connected to each other via a connector, the solid-state imaging device comprising:
photoelectric conversion elements;
read circuits that each read a signal generated by the photoelectric conversion elements; and
signal processing circuits that each include elements or circuits performing signal processing on the signal read by each read circuit,
wherein the photoelectric conversion elements are disposed in the first substrate,
wherein the read circuits are disposed in the second substrate and read the signals generated by the photoelectric conversion elements and transmitted via the connector,
wherein, in each signal processing circuit, some of the elements or the circuits included in the signal processing circuit are disposed in the first substrate, rest of the elements or the circuits included in the signal processing circuit are disposed in the second substrate, and the elements or the circuits disposed in the first substrate are electrically connected to the elements or the circuits disposed in the second substrate via the connector,
wherein, in the first substrate, some of the elements or the circuits of each signal processing circuit are disposed in a region other than a region of a pixel unit in which the photoelectric conversion elements are disposed, and
wherein the other region is a region smaller than a difference between a size of the first substrate in a case in which only the region of the pixel unit in which the photoelectric conversion elements are disposed is included, and a size of the second substrate in a case in which the read circuits and all of the elements or the circuits included in each signal processing circuit are disposed.

4. The solid-state imaging device according to claim 2, wherein a size of the first substrate including the region of the pixel unit and the other region is set to be the same as a size of the second substrate in which the read circuits and the rest of the elements or the circuits included in each signal processing circuit are disposed.

5. A solid-state imaging device in which first and second substrates are electrically connected to each other via a connector, the solid-state imaging device comprising:
photoelectric conversion elements;
read circuits that each read a signal generated by the photoelectric conversion elements; and
signal processing circuits that each include elements or circuits performing signal processing on the signal read by each read circuit,
wherein the photoelectric conversion elements are disposed in the first substrate,
wherein the read circuits are disposed in the second substrate and read the signals generated by the photoelectric conversion elements and transmitted via the connector,
wherein, in each signal processing circuit, some of the elements or the circuits included in the signal processing circuit are disposed in the first substrate, rest of the elements or the circuits included in the signal processing circuit are disposed in the second substrate, and the elements or the circuits disposed in the first substrate are electrically connected to the elements or the circuits disposed in the second substrate via the connector,
wherein, in the first substrate, some of the elements or the circuits of each signal processing circuit are disposed in a region other than a region of a pixel unit in which the photoelectric conversion elements are disposed,
wherein a size of the first substrate including the region of the pixel unit and the other region is set to be the same as a size of the second substrate in which the read circuits and the rest of the elements or the circuits included in each signal processing circuit are disposed, and
wherein, when the size of the first substrate in a case in which only the region of the pixel unit in which the photoelectric conversion elements are disposed is included is smaller than the size of the second substrate in a case in which the read circuits and all of the elements or the circuits included in each signal processing circuit are disposed, the size of the first substrate is set to be the same as the size of the second substrate by expanding the other region to move and dispose some of the elements or the circuits of each signal processing circuit disposed in the first substrate to expand the size of the first substrate and by reducing a region in which the rest of the elements or the circuits of each signal processing circuit in the second substrate are disposed to reduce the size of the second substrate.

6. The solid-state imaging device according to claim 1,
wherein each pixel in the solid-state imaging device includes the photoelectric conversion element disposed in the first substrate and the read circuits disposed in the second substrate, and
wherein the pixel outputs the signal generated by the photoelectric conversion element and read by the read circuit as an output signal from the pixel.

7. The solid-state imaging device according to claim 6,
wherein the pixel further includes
an amplification circuit that is disposed in the first substrate and outputs an amplified signal obtained by amplifying the signal generated by the photoelectric conversion element,
a load circuit that is disposed in the second substrate and serves as a load of the amplification circuit, and
a signal storage circuit that is disposed in the second substrate and stores the amplified signal output by the amplification circuit, and
wherein the pixel outputs the amplified signal stored in the signal storage circuit as the output signal from the pixel.

8. A solid-state imaging device in which first and second substrates are electrically connected to each other via a connector, the solid-state imaging device comprising:
photoelectric conversion elements;
read circuits that each read a signal generated by the photoelectric conversion elements; and
signal processing circuits that each include elements or circuits performing signal processing on the signal read by each read circuit,
wherein the photoelectric conversion elements are disposed in the first substrate,
wherein the read circuits are disposed in the second substrate and read the signals generated by the photoelectric conversion elements and transmitted via the connector,
wherein, in each signal processing circuit, some of the elements or the circuits included in the signal processing circuit are disposed in the first substrate, rest of the elements or the circuits included in the signal processing circuit are disposed in the second substrate, and the elements or the circuits disposed in the first substrate are electrically connected to the elements or the circuits disposed in the second substrate via the connector,
wherein each pixel in the solid-state imaging device includes the photoelectric conversion element disposed in the first substrate and the read circuits disposed in the second substrate,
wherein the pixel outputs the signal generated by the photoelectric conversion element and read by the read circuit as an output signal from the pixel,
wherein the pixel further includes
an amplification circuit that is disposed in the first substrate and outputs an amplified signal obtained by amplifying the signal generated by the photoelectric conversion element,
a load circuit that is disposed in the second substrate and serves as a load of the amplification circuit, and
a signal storage circuit that is disposed in the second substrate and stores the amplified signal output by the amplification circuit,
wherein the pixel outputs the amplified signal stored in the signal storage circuit as the output signal from the pixel, and
wherein the photoelectric conversion elements of all the pixels are simultaneously reset,
wherein, after a predetermined time has elapsed, the signals generated by the photoelectric conversion elements are simultaneously amplified by the amplification circuits of all the pixels,
wherein the amplified signals amplified by the amplification circuits are simultaneously stored in the signal storage circuits of all the pixels, and
wherein the amplified signals stored in the signal storage circuits are sequentially read by the read circuit and are output as the output signals from the pixels.

9. The solid-state imaging device according to claim 6,
wherein the signal processing circuit further includes a passive element, and
wherein some of elements or circuits including the passive element in each signal processing circuit are disposed in a region other than a region of a pixel unit in which the photoelectric conversion elements are disposed in the first substrate.

10. A solid-state imaging device in which first and second substrates are electrically connected to each other via a connector, the solid-state imaging device comprising:
photoelectric conversion elements;
read circuits that each read a signal generated by the photoelectric conversion elements; and
signal processing circuits that each include elements or circuits performing signal processing on the signal read by each read circuit,
wherein the photoelectric conversion elements are disposed in the first substrate,
wherein the read circuits are disposed in the second substrate and read the signals generated by the photoelectric conversion elements and transmitted via the connector,
wherein, in each signal processing circuit, some of the elements or the circuits included in the signal processing circuit are disposed in the first substrate, rest of the elements or the circuits included in the signal processing circuit are disposed in the second substrate, and the elements or the circuits disposed in the first substrate are electrically connected to the elements or the circuits disposed in the second substrate via the connector,
wherein each pixel in the solid-state imaging device includes the photoelectric conversion element disposed in the first substrate and the read circuits disposed in the second substrate,
wherein the pixel outputs the signal generated by the photoelectric conversion element and read by the read circuit as an output signal from the pixel,
wherein the signal processing circuit further includes a passive element,
wherein some of elements or circuits including the passive element in each signal processing circuit are disposed in a region other than a region of a pixel unit in which the photoelectric conversion elements are disposed in the first substrate, and wherein the other region is a region smaller than a difference between a size of the first substrate in a case in which only the region of the pixel unit in which the photoelectric conversion elements are disposed is included and a size of the second substrate in a case in which the read circuits and all of the elements or the circuits included in each signal processing circuit are disposed.

11. The solid-state imaging device according to claim 9, wherein a size of the first substrate in which the region of the pixel unit and the other region are included is set to be the same as a size of the second substrate in which the read circuit and the rest of the elements or the circuits included in each signal processing circuit are disposed.

12. A solid-state imaging device in which first and second substrates are electrically connected to each other via a connector, the solid-state imaging device comprising:
photoelectric conversion elements;
read circuits that each read a signal generated by the photoelectric conversion elements; and
signal processing circuits that each include elements or circuits performing signal processing on the signal read by each read circuit,
wherein the photoelectric conversion elements are disposed in the first substrate,
wherein the read circuits are disposed in the second substrate and read the signals generated by the photoelectric conversion elements and transmitted via the connector,
wherein, in each signal processing circuit, some of the elements or the circuits included in the signal processing circuit are disposed in the first substrate, rest of the elements or the circuits included in the signal processing circuit are disposed in the second substrate, and the elements or the circuits disposed in the first substrate are electrically connected to the elements or the circuits disposed in the second substrate via the connector,
wherein each pixel in the solid-state imaging device includes the photoelectric conversion element disposed in the first substrate and the read circuits disposed in the second substrate,
wherein the pixel outputs the signal generated by the photoelectric conversion element and read by the read circuit as an output signal from the pixel,
wherein the signal processing circuit further includes a passive element,
wherein some of elements or circuits including the passive element in each signal processing circuit are disposed in a region other than a region of a pixel unit in which the photoelectric conversion elements are disposed in the first substrate,
wherein a size of the first substrate in which the region of the pixel unit and the other region are included is set to be the same as a size of the second substrate in which the read circuit and the rest of the elements or the circuits included in each signal processing circuit are disposed, and
wherein, when the size of the first substrate in a case in which only the region of the pixel unit in which the photoelectric conversion element is disposed is included is smaller than the size of the second substrate in a case in which the read circuit and all of the elements or the circuits included in each signal processing circuit are disposed, the size of the first substrate is set to be the same as the size of the second substrate by expanding the other region to move and dispose some of the elements or the circuits including the passive element of each signal processing circuit disposed in the first substrate to expand the size of the first substrate and by reducing a region in which the rest of the elements or the circuits of each signal processing circuit in the second substrate are disposed to reduce the size of the second substrate.

13. The solid-state imaging device according to claim 9, wherein the passive element is a capacitor element that retains the output signal output from the pixel.

14. The solid-state imaging device according to claim 9, wherein the signal processing circuit further includes a signal amplification circuit.

15. The solid-state imaging device according to claim 1, wherein the connector between the first and second substrates are connected in a wafer state and the first and second substrates are cut to a size of the solid-state imaging device after the first and second substrates are connected to each other.

16. The solid-state imaging device according to claim 1, wherein a semiconductor process of manufacturing the first substrate and a semiconductor process of manufacturing the second substrate are different semiconductor processes.

17. The solid-state imaging device according to claim 1,
wherein the signal processing circuit further includes a noise signal reduction circuit that reduces noise from the read signal, and
wherein, among elements or circuits included in the noise signal reduction circuit, an element or a circuit corresponding to a passive element is disposed as an element or circuit of the signal processing circuit in the first substrate.

18. The solid-state imaging device according to claim 17, wherein, among the elements or circuits included in the noise signal reduction circuit, elements or circuits other than the element or the circuit corresponding to the passive element in the noise signal reduction circuit are disposed as the rest of the elements or the circuits of the signal processing circuit in the second substrate.

19. The solid-state imaging device according to claim 1,
wherein the signal processing circuit further includes a noise signal reduction circuit that reduces noise from the read signal,
wherein elements corresponding to passive elements included in the noise signal reduction circuit are configured as a plurality of elements, and
wherein, among elements or circuits included in the noise signal reduction circuit, elements or circuits including the elements corresponding to some of the passive elements are disposed as some of the elements or the circuits of the signal processing circuit in the first substrate.

20. The solid-state imaging device according to claim 19,
wherein the noise signal reduction circuit includes a signal amplification circuit, and
wherein, among the elements or the circuits included in the noise signal reduction circuit, the elements or the circuits including the signal amplification circuit are disposed as the rest of the elements or the circuits of the signal processing circuit in the second substrate.

21. The solid-state imaging device according to claim 1, wherein some of the elements or the circuits of the signal processing circuit are elements or circuits having a relatively larger area when disposed in the substrate, among all of the elements or the circuits of the signal processing circuit.

22. The solid-state imaging device according to claim 1,
wherein, in the solid-state imaging device, a plurality of pixels that each include the photoelectric conversion element disposed in the first substrate and the read circuit disposed in the second substrate are arrayed in a matrix form, and wherein the plurality of signal processing circuits are disposed in correspondence with columns of the plurality of pixels arrayed in the matrix form.

23. A solid-state imaging device in which first and second substrates are electrically connected to each other via a connector, the solid-state imaging device comprising:

photoelectric conversion elements;

read circuits that each read a signal generated by the photoelectric conversion elements; and signal processing circuits that each include elements or circuits performing signal processing on the signal read by each read circuit, wherein the photoelectric conversion elements are disposed in the first substrate, wherein the read circuits are disposed in the second substrate and read the signals generated by the photoelectric conversion elements and transmitted via the connector, wherein, in each signal processing circuit, some of the elements or the circuits included in the signal processing circuit are disposed in the first substrate, rest of the elements or the circuits included in the signal processing circuit are disposed in the second substrate, and the elements or the circuits disposed in the first substrate are electrically connected to the elements or the circuits disposed in the second substrate via the connector, and wherein the connector of the signal processing circuits disposed in a column direction of the pixels are disposed to be shifted from the disposition positions of the connector of the other adjacent signal processing circuits, without being arranged in the column direction of the pixels, in a region in which the elements or the circuits included in each signal processing circuit are disposed.

24. The solid-state imaging device according to claim 1, further comprising:

a signal storage circuit that stores the signal generated by the photoelectric conversion element, wherein the read circuit reads the signal stored in the signal storage circuit.

25. The solid-state imaging device according to claim 24, wherein the signal storage circuit is disposed in the second substrate.

26. The solid-state imaging device according to claim 24, further comprising:

an amplification circuit that outputs an amplified signal obtained by amplifying the signal generated by the photoelectric conversion element, wherein the signal storage circuit stores the amplified signal amplified by the amplification circuit.

27. The solid-state imaging device according to claim 26, further comprising:

a noise reduction circuit that reduces noise from the amplified signal amplified by the amplification circuit, wherein the signal storage circuit stores the amplified signal from which the noise is reduced by the noise reduction circuit.

28. The solid-state imaging device according to claim 27, wherein the amplification circuit includes an amplification transistor of which a gate receives the signal generated by the photoelectric conversion element and one of a source and a drain outputs the amplified signal.

29. The solid-state imaging device according to claim 28, wherein the noise reduction circuit includes a clamp capacitor that is connected directly or indirectly to one of the source and the drain of the amplification transistor and clamps the output amplified signal, and a sample and hold transistor that is connected directly or indirectly to the clamp capacitor, and samples and holds the clamped amplified signal, and wherein the signal storage circuit stores the amplified signal sampled and held by the sample and hold transistor.

30. The solid-state imaging device according to claim 24, wherein a connection point of each connector on a side of the first substrate and a connection point of each connector on a side of the second substrate are disposed at one position on a path from an output terminal of the photoelectric conversion element to an input terminal of the signal storage circuit.

31. The solid-state imaging device according to claim 1, wherein the second substrate is connected to an opposite surface to the surface of the first substrate to which light incident on the photoelectric conversion element is radiated.

32. The solid-state imaging device according to claim 1, wherein a pixel unit of the first substrate includes the photoelectric conversion element, a transfer circuit that transfers the signal generated by the photoelectric conversion element, a first amplification circuit that amplifies the signal generated by the photoelectric conversion element, and a first reset circuit that resets an input portion of the first amplification circuit, and wherein a pixel unit of the second substrate includes an analog memory circuit, a second amplification circuit that amplifies a signal of the analog memory circuit, and a second reset circuit that resets an input portion of the second amplification circuit.

33. A method of controlling a solid-state imaging device in which first and second substrates are electrically connected to each other via connector, the method of controlling a solid-state imaging device comprising:

reading a signal generated by a photoelectric conversion element of a pixel disposed in the first substrate and transmitted via the connector by a read circuit of the pixel disposed in the second substrate;

performing signal processing on an output pixel signal of the pixel by a signal processing circuit in which some of the elements or the circuits are disposed in the first substrate, rest of the elements or the circuits are disposed in the second substrate, and the elements or the circuits disposed in the first substrate are electrically connected to the elements or the circuits disposed in the second substrate via the connector; and outputting an output signal from the signal processing circuit to an output circuit and the output circuit outputting the output signal received from the signal processing circuit as an output signal of the solid-state imaging device.

34. An imaging device in which first and second substrates are electrically connected to each other via connector, the imaging device comprising:

a pixel having a photoelectric conversion element and a read circuit that reads a signal generated by the photoelectric conversion element;

a signal processing circuit that includes elements or circuits performing signal processing on a pixel signal outputted from the pixel; and an output circuit that receives a signal outputted from the signal processing circuit and outputs the received signal as an output signal of the imaging device, wherein the photoelectric conversion element of the pixel is disposed in the first substrate, wherein the read circuit of the pixel is disposed in the second substrate and reads the signal generated by the photoelectric conversion element and transmitted via the connector, and wherein, in the signal processing circuit, some of elements or circuits included in the signal processing circuit are disposed in the first substrate, rest of the elements or the circuits included in the signal processing circuit are disposed in the second substrate, and the elements or the circuits disposed in the first substrate are electrically connected to the elements or the circuits disposed in the second substrate via the connector.

35. A solid-state imaging device in which first and second substrates are electrically connected to each other via connector, the solid-state imaging device comprising:

a photoelectric conversion element;

a read transistor of which one of a source and a drain receives a signal generated by the photoelectric conversion element and the other of the source and the drain outputs the signal; and a signal processing circuit that includes capacitors or transistors performing signal processing on the signal output by the read transistor, wherein the photoelectric conversion element is disposed in the first substrate, wherein the read transistor is disposed in the second substrate and outputs the signal generated by the photoelectric conversion element and transmitted via the connector, and wherein, in the signal processing circuit, some of the capacitors or the transistors included in the signal processing circuit are disposed in the first substrate, rest of the capacitors or the transistors included in the signal processing circuit are disposed in the second substrate, and the capacitors or the transistors disposed in the first substrate are electrically connected to the capacitors or the transistors disposed in the second substrate via the connector.

36. The solid-state imaging device according to claim 35, wherein, in the first substrate, some of the capacitors or the transistors of the signal processing circuit are disposed in a region other than a region of a pixel unit in which the photoelectric conversion element is disposed.

37. The solid-state imaging device according to claim 35, wherein a pixel in the solid-state imaging device includes the photoelectric conversion element disposed in the first substrate and the read transistor disposed in the second substrate, wherein the pixel further includes an amplification transistor which is disposed in the first substrate, of which a gate receives the signal generated by the photoelectric conversion element, and which outputs an amplified signal amplified by one of a source and a drain, a load transistor that is disposed in the second substrate and serves as a load of the amplification transistor, and a signal storage capacitor that is disposed in the second substrate and stores the amplified signal output by the amplification transistor, and wherein the pixel outputs the amplified signal read by the read transistor and stored in the signal storage capacitor as an output signal from the pixel.

38. The solid-state imaging device according to claim 35, wherein the signal processing circuit further includes a signal amplification amplifier.

39. The solid-state imaging device according to claim 35, wherein the signal processing circuit further includes a noise signal reduction circuit that reduces noise from the read signal, and wherein, among capacitors or transistors included in the noise signal reduction circuit, a capacitor or a transistor corresponding to a passive element is disposed as a capacitor or transistor of the signal processing circuit in the first substrate.

40. The solid-state imaging device according to claim 39, wherein, among the capacitors or the transistors included in the noise signal reduction circuit, capacitors or transistors other than the capacitor or the transistor corresponding to the passive element in the noise signal reduction circuit are disposed as the rest of the capacitors or the transistors of the signal processing circuit in the second substrate.

41. The solid-state imaging device according to claim 35, wherein the signal processing circuit further includes a noise signal reduction circuit that reduces noise from the read signal, wherein capacitors corresponding to passive elements included in the noise signal reduction circuit are configured as a plurality of capacitors, and wherein, among capacitors or transistors included in the noise signal reduction circuit, capacitors or transistors including the capacitors corresponding to some of the passive elements are disposed as some of the capacitors or the transistors of the signal processing circuit in the first substrate.

42. The solid-state imaging device according to claim 41, wherein the noise signal reduction circuit includes a signal amplification amplifier, and wherein, among the capacitors or the transistors included in the noise signal reduction circuit, capacitors or transistors including the signal amplification circuit are disposed as the rest of the capacitors or the transistors of the signal processing circuit in the second substrate.

43. The solid-state imaging device according to claim 35, further comprising:

a signal storage capacitor that stores the signal generated by the photoelectric conversion element, wherein the read transistor reads the signal stored in the signal storage capacitor.

44. The solid-state imaging device according to claim 43, wherein the signal storage capacitor is disposed in the second substrate.

45. The solid-state imaging device according to claim 43, further comprising:

an amplification transistor of which a gate receives the signal generated by the photoelectric conversion element and which outputs an amplified signal amplified by one of a source and a drain, wherein the signal storage capacitor stores the amplified signal output by the amplification transistor.

46. The solid-state imaging device according to claim 45, further comprising:

a clamp capacitor that is connected directly or indirectly to one of the source and the drain of the amplification transistor and clamps the output amplified signal; and a sample and hold transistor which is connected directly or indirectly to the clamp capacitor, in which one of a source and a drain receives the amplified signal clamped by the clamp capacitor and samples and holds the amplified signal, and the other of the source and the drains outputs the amplified signal, wherein the signal storage capacitor stores the amplified signal sampled and held by the sample and hold transistor.

47. The solid-state imaging device according to claim 35, wherein a pixel unit of the first substrate includes
the photoelectric conversion element,
a transfer transistor of which one of a source and a drain receives the signal generated by the photoelectric conversion element and the other of the source and the drain outputs the signal generated by the photoelectric conversion element,
a first amplification transistor of which a gate receives the signal output by the transfer transistor and one of a source and a drain outputs a first amplified signal, and
a first reset transistor that resets the gate of the first amplification transistor, and
wherein a pixel unit of the second substrate includes
an analog memory circuit,
a second amplification transistor of which a gate receives a signal of the analog memory circuit and one of a source and a drain outputs a second amplified signal, and
a second reset transistor that resets the gate of the second amplification transistor.

48. A method of controlling a solid-state imaging device in which first and second substrates are electrically connected to each other via connectors, the method of controlling a solid-state imaging device comprising:
outputting a signal, which is generated by a photoelectric conversion element disposed in the first substrate and transmitted via the connector and received by one of a source and a drain of a read transistor disposed in the second substrate, from the other of the source and the drain of the read transistor; and
performing signal processing on the signal output from the other of the source and the drain of the read transistor by a signal processing circuit in which some of capacitors or transistors are disposed in the first substrate, rest of capacitors or transistors are disposed in the second substrate, and the capacitors or the transistors disposed in the first substrate are electrically connected to the capacitors or the transistors disposed in the second substrate via the connector.

49. An imaging device in which first and second substrates are electrically connected to each other via connector, the imaging device comprising:
a photoelectric conversion element;
a read transistor of which one of a source and a drain receives a signal generated by the photoelectric conversion element and the other of the source and the drain outputs the signal; and
a signal processing circuit that includes capacitors or transistors performing signal processing on the signal output by the read transistor,
wherein the photoelectric conversion element is disposed in the first substrate,
wherein the read transistor is disposed in the second substrate and outputs the signal generated by the photoelectric conversion element and transmitted via the connector, and
wherein, in the signal processing circuit, some of the capacitors or the transistors included in the signal processing circuit are disposed in the first substrate, rest of the capacitors or the transistors included in the signal processing circuit are disposed in the second substrate, and the capacitors or the transistors disposed in the first substrate are electrically connected to the capacitors or the transistors disposed in the second substrate via the connector.

* * * * *